US012621958B2

(12) United States Patent
Nakamura

(10) Patent No.: US 12,621,958 B2
(45) Date of Patent: May 5, 2026

(54) COOLING COMPONENT INCLUDING SUPPLY PORTS AND DISCHARGE PORTS

(71) Applicant: NEC Platforms, Ltd., Kawasaki (JP)

(72) Inventor: Yasuhito Nakamura, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 197 days.

(21) Appl. No.: 18/567,409

(22) PCT Filed: Apr. 20, 2022

(86) PCT No.: PCT/JP2022/018252
§ 371 (c)(1),
(2) Date: Dec. 6, 2023

(87) PCT Pub. No.: WO2022/259770
PCT Pub. Date: Dec. 15, 2022

(65) Prior Publication Data
US 2024/0276674 A1      Aug. 15, 2024

(30) Foreign Application Priority Data

Jun. 10, 2021    (JP) ................................. 2021-097539

(51) Int. Cl.
*H05K 7/20*           (2006.01)
*H01L 23/473*         (2006.01)
(52) U.S. Cl.
CPC ..... *H05K 7/20254* (2013.01); *H01L 23/4735* (2013.01)
(58) Field of Classification Search
CPC ........................ H05K 7/20254; H01L 23/4735
See application file for complete search history.

(56) References Cited

U.S. PATENT DOCUMENTS 5,388,635 A * 2/1995 Gruber ...................... F28F 3/12
257/E23.09
2007/0034356 A1    2/2007 Kenny et al.
2020/0084913 A1    3/2020 Jia

FOREIGN PATENT DOCUMENTS

JP      2005-011928 A     1/2005
JP      2007-142390 A     6/2007
(Continued)

OTHER PUBLICATIONS

Extended European Search Report for EP Application No. 22819956.
8, dated on Apr. 28, 2025.
(Continued)

*Primary Examiner* — Zachary Pape
(74) *Attorney, Agent, or Firm* — Sughrue Mion, PLLC

(57)      ABSTRACT
A cooling component includes a heat receiving plate that receives heat from the cooling target object; a plurality of heat dissipating plates disposed at predetermined intervals on the heat receiving plate; a refrigerant supplying path for supplying a refrigerant to the plurality of heat dissipating plates; a refrigerant discharging path to which the refrigerant is supplied from the plurality of heat dissipating plates; and a refrigerant passing member in which a plurality of through-holes through which the refrigerant passes are formed, wherein the refrigerant supplied by the refrigerant supplying path passes through some of the through-holes, while the refrigerant that passes through the remainder of the plurality of through-holes is discharged by the refrigerant discharging path, and some of the plurality of through-holes and the remainder of the plurality of through-holes are adjacent to each other.

3 Claims, 23 Drawing Sheets

(56)     References Cited

FOREIGN PATENT DOCUMENTS

| JP | 2014-183260 A | 9/2014 |
| JP | 2019-160831 A | 9/2019 |
| WO | 2019/043801 A1 | 3/2019 |

OTHER PUBLICATIONS

International Search Report for PCT Application No. PCT/JP2022/018252, mailed on Jul. 19, 2022.
English translation of Written opinion for PCT Application No. PCT/JP2022/018252, mailed on Jul. 19, 2022.

* cited by examiner

COOLING COMPONENT INCLUDING SUPPLY PORTS AND DISCHARGE PORTS

This application is a National Stage Entry of PCT/JP2022/018252 filed on Apr. 20, 2022, which claims priority from Japanese Patent Application 2021-097539 filed on Jun. 10, 2021, the contents of all of which are incorporated herein by reference, in their entirety.

TECHNICAL FIELD

The present invention relates to a cooling component.

BACKGROUND ART

A cooling component that receives heat from an electronic component that generates heat, and cools the electronic component is present. PTL 1 describes that a partition plate is provided inside a cooling component, and that a plurality of flow paths through which a liquid refrigerant passes are formed by the partition plate. The liquid refrigerant flows in from supply holes (supply ports) of the flow paths, passes through the flow paths separated by the partition plate, and is discharged from discharge holes (discharge ports).

CITATION LIST

Patent Literature

PTL 1: JP 2005-11928 A

SUMMARY OF INVENTION

Technical Problem

However, in the cooling component described in PTL 1, the liquid refrigerant receives heat from an electronic component as the liquid refrigerant passes through the flow paths. Due to the reception of the heat, in each of the plurality of flow paths, the temperature of the liquid refrigerant passing through the vicinity of the discharge ports increases as compared with the temperature of the liquid refrigerant passing through the vicinity of the supply ports. In other words, a portion of the electronic component near the discharge ports is cooled by the liquid refrigerant whose temperature has increased. As described above, the cooling component described in PTL 1 has a problem that the electronic component cannot be uniformly cooled.

An object of the present invention is to provide a cooling component capable of substantially uniformly cooling a cooling target object.

Solution to Problem

According to one aspect of the present invention, a cooling component includes a heat receiving plate that receives heat from a cooling target object, a plurality of heat dissipating plates disposed at predetermined intervals on the heat receiving plate, a refrigerant supplying path that supplies a refrigerant to the plurality of heat dissipating plates, a refrigerant discharging path to which the refrigerant is supplied from the plurality of heat dissipating plates, and a refrigerant passing member in which a plurality of through-holes through which the refrigerant passes are formed. The refrigerant supplied by the refrigerant supplying path passes through some through-holes among the plurality of through-holes, the refrigerant that has passed through a remainder of the plurality of through-holes is discharged by the refrigerant discharging path, and the some through-holes among the plurality of through-holes and the remainder of the plurality of through-holes are adjacent to each other.

Advantageous Effects of Invention

By the cooling component of the present invention, the cooling target object can be cooled substantially uniformly.

BRIEF DESCRIPTION OF DRAWINGS

FIG. 10 is a cross-sectional view illustrating a configuration example of the cooling component according to the second example embodiment of the present invention.

FIG. 17 is an exploded perspective view of the cooling component according to the third example embodiment of the present invention.

FIG. 18 is a cross-sectional view illustrating a configuration example of the cooling component according to the third example embodiment of the present invention.

FIG. 19 is a schematic view schematically illustrating a direction in which a refrigerant flows using the cross-sectional view in the cooling component according to the third example embodiment of the present invention.

EXAMPLE EMBODIMENTS

First Example Embodiment

A first example embodiment of the present invention will be described.

Figure 1:
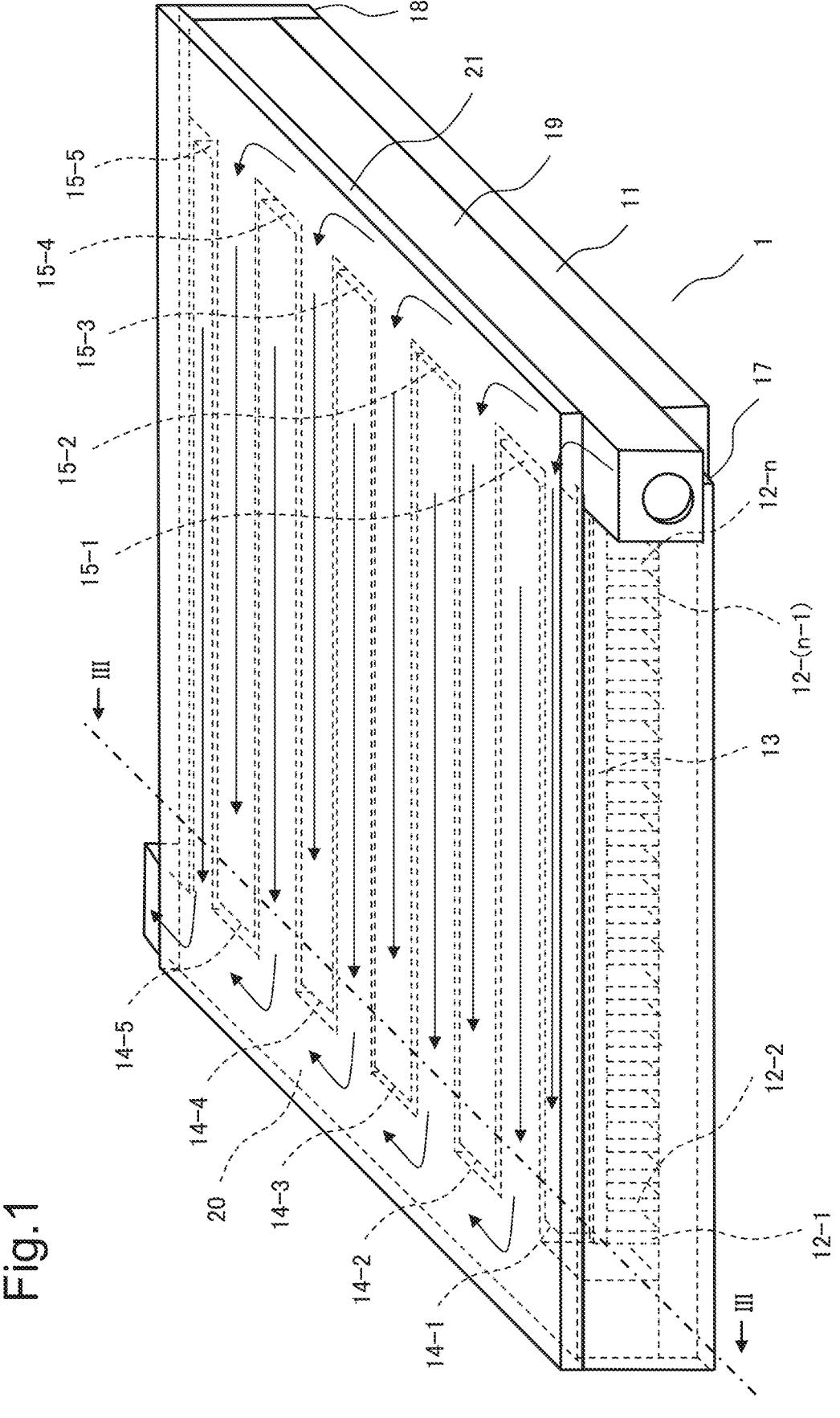
FIG. 1 is a transparent perspective view illustrating a configuration example of a cooling component according to a first example embodiment of the present invention.
Figure 2:
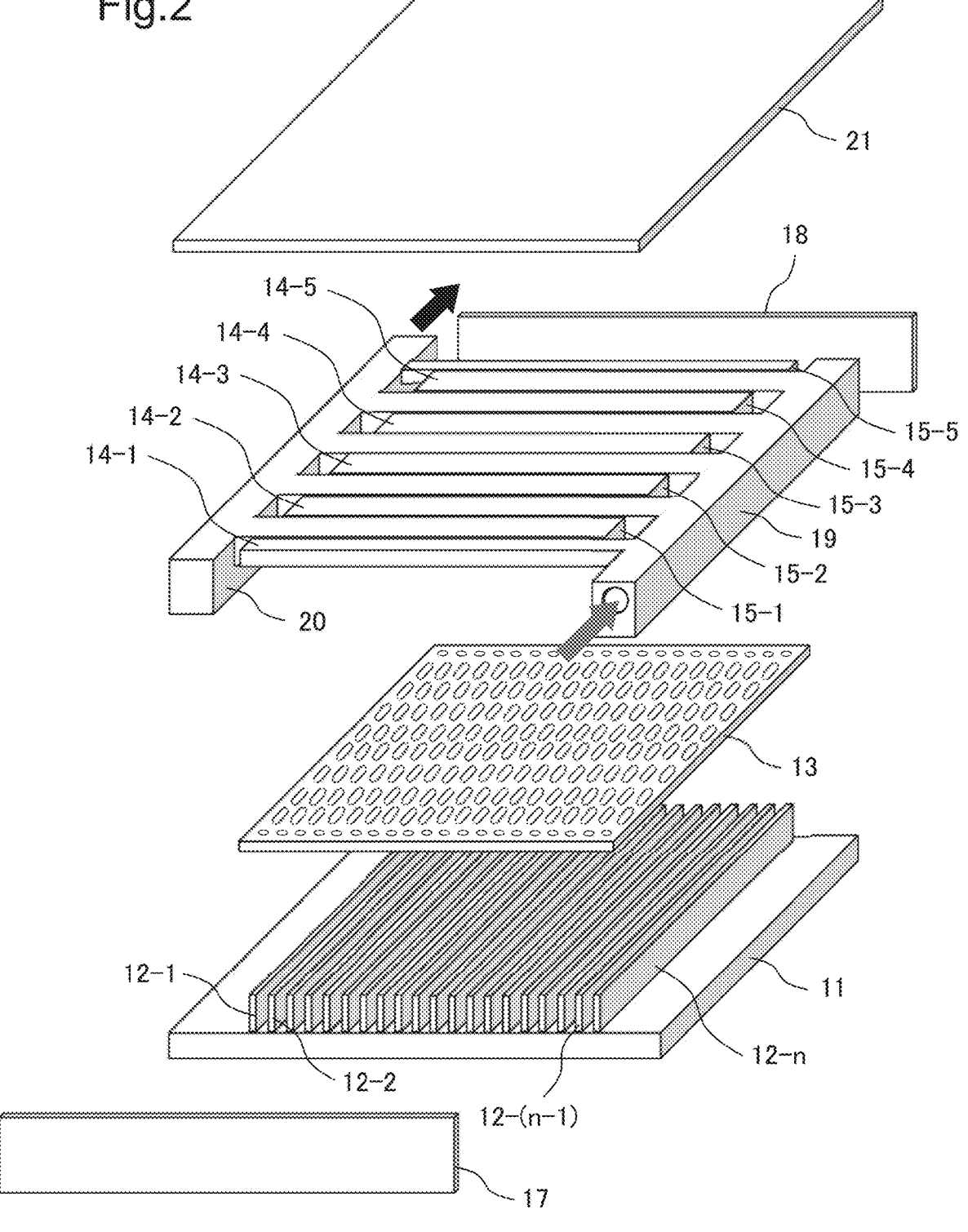
FIG. 2 is an exploded perspective view of the cooling component according to the first example embodiment of the present invention.
Figure 3:
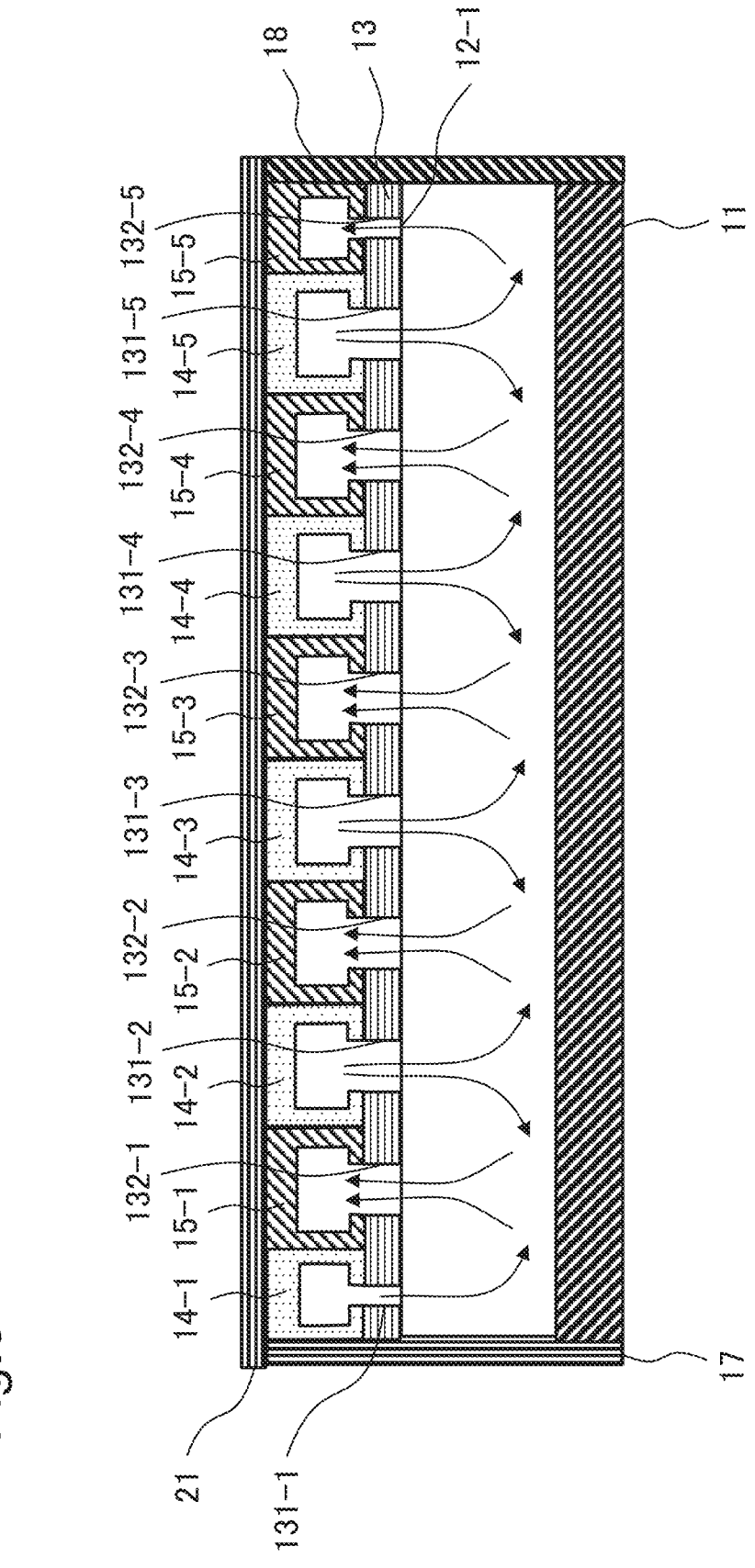
FIG. 3 is a cross-sectional view illustrating a configuration example of the cooling component according to the first example embodiment of the present invention.

FIG. 1 is a transparent perspective view illustrating a configuration example of a cooling component 1 according to the present example embodiment. FIG. 2 is an exploded perspective view of the cooling component 1 illustrated in FIG. 1. FIG. 3 is a cross-sectional view of the cooling component 1 taken along line III-III in FIG. 1. Arrows in FIGS. 1, 2, and 3 schematically indicate directions in which a cooling medium (refrigerant) flows. In FIG. 1, line III-III is illustrated at a position between a heat dissipating plate 12-1 and a heat dissipating plate 12-2 described later.

As illustrated in FIGS. 1 to 3, the cooling component 1 of the present example embodiment includes a heat receiving plate 11, a plurality of heat dissipating plates 12-1 to 12-*n* (n is an integer of 2 or more) arranged at predetermined intervals on the heat receiving plate 11, and a refrigerant passing member 13. As illustrated in FIGS. 1 to 3, the cooling component 1 includes a plurality of refrigerant supplying path 14-1 to 14-5 disposed on the refrigerant passing member 13, and a plurality of refrigerant discharging path 15-1 to 15-5 disposed on the refrigerant passing member 13.

The heat receiving plate 11 receives heat from a cooling target object (not illustrated) to cool the cooling target object. For example, the cooling target object directly contacts a lower surface of the heat receiving plate 11. Alternatively, the cooling target object is coupled to the lower surface of the heat receiving plate 11 via an inclusion. The cooling target object is, for example, an electronic component such as a semiconductor circuit.

The cooling component 1 includes a partition plate 17 and a partition plate 18 disposed on both end sides of the heat dissipating plates 12-1 to 12-*n*. The cooling component 1 further includes a supply pipe 19 for supplying the refrigerant and a discharge pipe 20 for discharging the refrigerant. Each of the refrigerant supplying path 14-1 to 14-5 is connected to the supply pipe 19. Each of the refrigerant discharging path 15-1 to 15-5 is connected to the discharge pipe 20. Each of the refrigerant supplying path 14-1 to 14-5, each of the refrigerant discharging path 15-1 to 15-5, the supply pipe 19, and the discharge pipe 20 have a rectangular outer peripheral wall. The number of the refrigerant supplying path 14-1 to 14-5 and the number of the refrigerant discharging path 15-1 to 15-5 are not limited to five. The shape of the outer peripheral wall of each pipe is not limited to a rectangular shape.

Cylindrical spaces forming flow paths through which the refrigerant passes are provided inside the supply pipe 19 and the discharge pipe 20. In the supply pipe 19, the central axis of the cylindrical space provided in the supply pipe 19 is disposed in parallel to the longitudinal direction of the heat dissipating plates 12-1 to 12-*n*. In the discharge pipe 20, the central axis of the cylindrical space provided in the discharge pipe 20 is disposed in parallel to the longitudinal direction of the heat dissipating plates 12-1 to 12-*n*.

A refrigerant circulation device (not illustrated) is connected between the supply pipe 19 and the discharge pipe 20 and circulates the refrigerant. For example, the refrigerant circulation device cools the refrigerant discharged from the discharge pipe 20, and then re-supplies the refrigerant to the supply pipe 19.

The refrigerant supplying path 14-1 to 14-5 and the refrigerant discharging path 15-1 to 15-5 are disposed in such a way as to be in close contact with each other on the refrigerant passing member 13. Each of the refrigerant supplying path 14-1 to 14-5 supplies the refrigerant to the plurality of heat dissipating plates 12-1 to 12-*n*. The refrigerant is supplied from the plurality of heat dissipating plates 12-1 to 12-*n* to the refrigerant discharging path 15-1 to 15-5. As illustrated in FIG. 3, each of the refrigerant supplying path 14-1 to 14-5 and each of the refrigerant discharging path 15-1 to 15-5 are provided with a flow path having a rectangular cross section. Each of the refrigerant supplying path 14-1 to 14-5 and each of the refrigerant discharging path 15-1 to 15-5 may have a circular cross section. As illustrated in FIGS. 1 and 2, the refrigerant supplying path 14-1 to 14-5 and the refrigerant discharging path 15-1 to 15-5 are arranged, for example, in a direction orthogonal to the longitudinal direction of the heat dissipating plates 12-1 to 12-*n*.

The cooling component 1 includes a top plate 21 disposed at the uppermost portion of the cooling component 1.

A plurality of spaces surrounded by the heat receiving plate 11, the plurality of heat dissipating plates 12-1 to 12-*n*, and the refrigerant passing member 13 are provided inside the cooling component 1. In a second example embodiment and a third example embodiment described later, the spaces are referred to as convection chambers.

In the cooling component 1, for example, the heat receiving plate 11 and the heat dissipating plates 12-1 to 12-*n* are formed by skiving. The configurations of the cooling component 1 are joined by brazing, for example. As described above, since the cooling component 1 can be manufactured by skiving and brazing that are generally less expensive than etching, the cooling component 1 can be manufactured at low cost.

Figure 4:
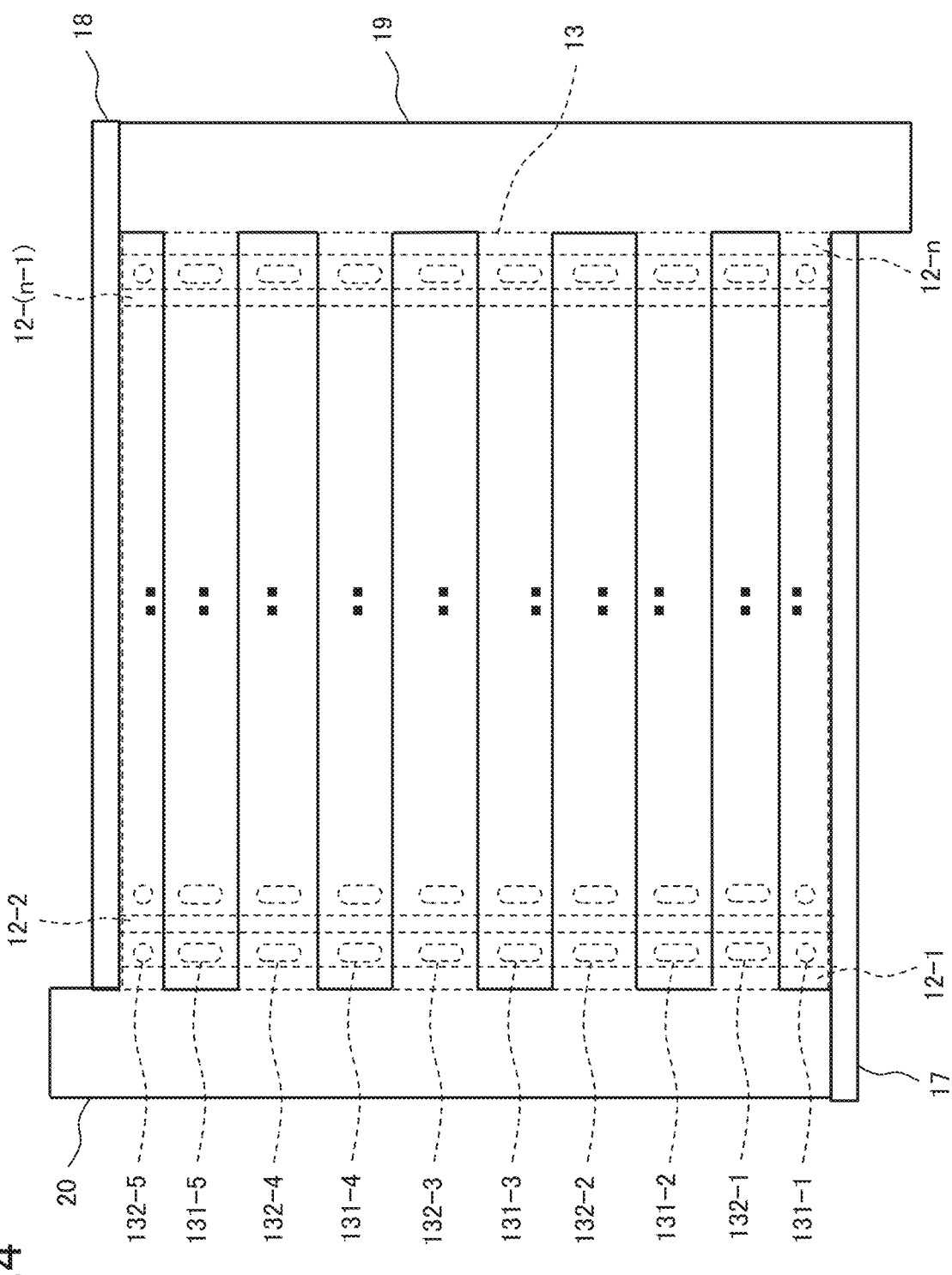
FIG. 4 is a top perspective view of the cooling component according to the first example embodiment of the present invention in a state where a top plate of the cooling component is removed.

FIG. 4 is a top perspective view of the cooling component 1 illustrated in FIG. 1 in a state where the top plate 21 of the cooling component 1 is removed. In FIG. 4, the refrigerant passing member 13 and the heat dissipating plates 12-1, 12-2, 12-(*n*–1), and 12-*n* are indicated by broken lines, and illustration of the other heat dissipating plates 12-3 to 12-(*n*–2) is omitted.

Figure 5:
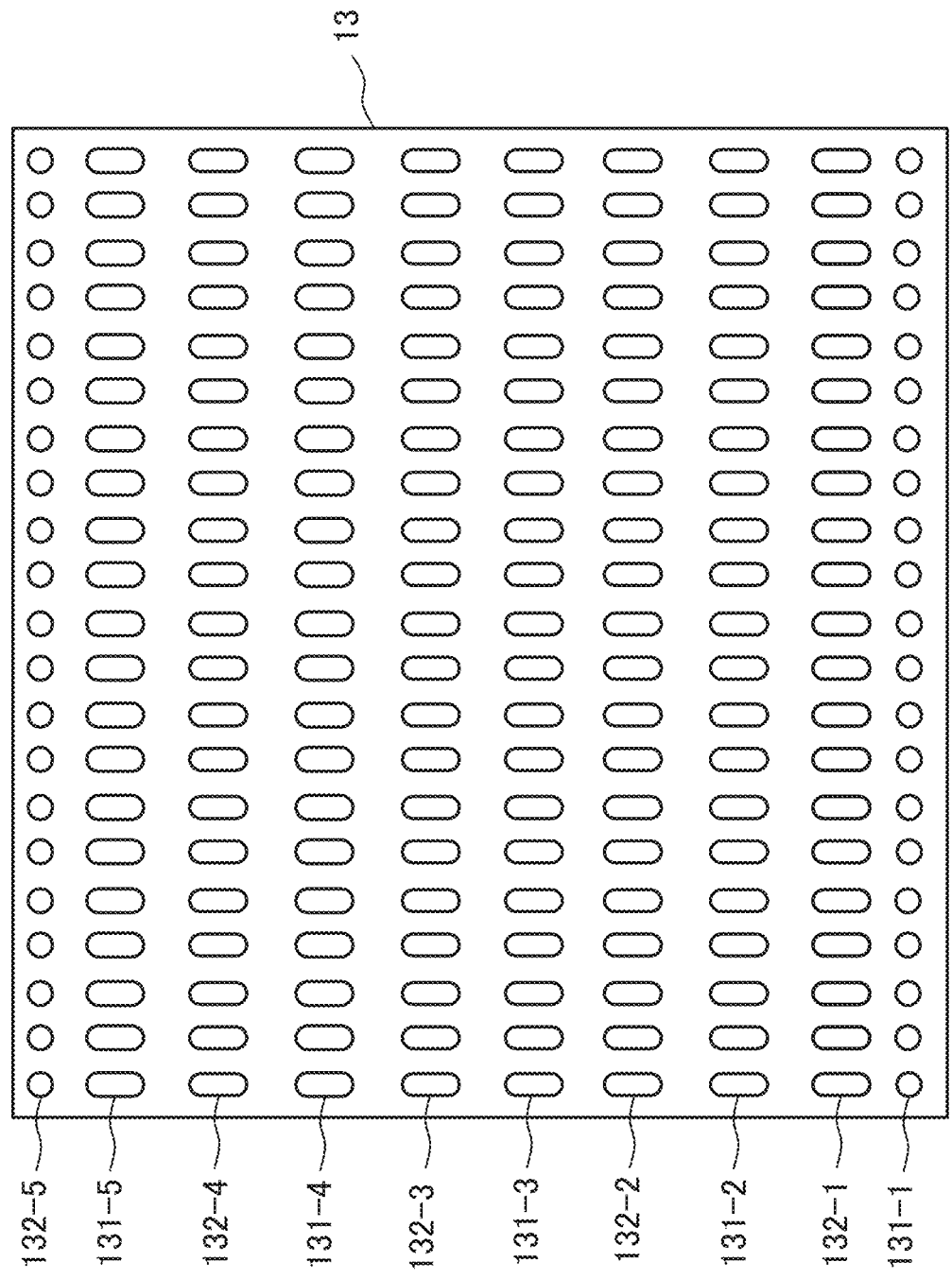
FIG. 5 is a plan view illustrating a configuration example of a refrigerant passing member of the cooling component according to the first example embodiment of the present invention.

FIG. 5 is a plan view illustrating a configuration example of the refrigerant passing member 13. As illustrated in FIG. 2, the refrigerant supplying path 14-1 to 14-5 and the refrigerant discharging path 15-1 to 15-5 are disposed on the refrigerant passing member 13. The refrigerant passing member 13 has a plurality of through-holes (a plurality of supply ports 131-1 to 131-5 and a plurality of discharge ports 132-1 to 132-5 to be described later) through which the refrigerant passes. Specifically, the refrigerant passing member 13 is provided with the plurality of supply ports 131-1 to 131-5 that are some through-holes among the plurality of through-holes and through which the refrigerant to be supplied from the refrigerant supplying path 14-1 to 14-5 to the plurality of heat dissipating plates 12-1 to 12-*n* passes. The refrigerant passing member 13 is provided with the plurality of discharge ports 132-1 to 132-5 that are the remainder of the plurality of through-holes and through which the refrigerant to be supplied from the plurality of heat dissipating plates 12-1 to 12-*n* to the refrigerant discharging path 15-1 to 15-5 passes. The plurality of supply ports 131-1 to 131-5 that are some through-holes among the plurality of through-holes, and the plurality of discharge ports 132-1 to 132-5 that are the remainder of the plurality of through-holes, are adjacent to each other. That is, the plurality of supply ports 131-1 to 131-5 and the plurality of discharge ports 132-1 to 132-5 are alternately provided in the longitudinal direction of the heat dissipating plates 12-1 to 12-*n*.

The plurality of supply ports 131-1 are arranged, for example, in a direction orthogonal to the longitudinal direction of the heat dissipating plates 12-1 to 12-*n* and at positions facing the refrigerant supplying path 14-1. The plurality of discharge ports 132-1 are arranged, for example, in the direction orthogonal to the longitudinal direction of the heat dissipating plates 12-1 to 12-*n* and at positions facing the refrigerant discharging path 15-1.

Similarly, the plurality of supply ports 131-2 are arranged, for example, in the direction orthogonal to the longitudinal direction of the heat dissipating plates 12-1 to 12-*n* and at positions facing the refrigerant supplying path 14-2. The plurality of discharge ports 132-2 are arranged, for example, in the direction orthogonal to the longitudinal direction of the heat dissipating plates 12-1 to 12-*n* and at positions facing the refrigerant discharging path 15-2.

The positional relationships between the plurality of supply ports 131-3 to 131-5 and the plurality of discharge ports 132-3 to 132-5, and the refrigerant supplying path 14-3 to 14-5 and the refrigerant discharging path 15-3 to 15-5 are the same as the positional relationship described above.

The flow path inside each of the refrigerant supplying path 14-1 to 14-5 is connected to each of the through-holes (in the present example embodiment, the supply ports 131-1 to 131-5) among the plurality of through-holes of the refrigerant passing member 13 illustrated in FIG. 5. Each of the refrigerant supplying path 14-1 to 14-5 supplies the refrigerant from the supply pipe 19 to each of the spaces surrounded by the heat receiving plate 11, each of the plurality of heat dissipating plates 12-1 to 12-*n*, and the refrigerant passing member 13 through each of the supply ports 131-1 to 131-5. Meanwhile, the flow path inside each of the refrigerant discharging path 15-1 to 15-5 is connected to the remainder (in the present example embodiment, the discharge ports 132-1 to 132-5) of the plurality of through-holes that is adjacent to the through-holes (in the present example embodiment, the supply ports 131-1 to 131-5) among the plurality of through-holes of the refrigerant passing member 13 illustrated in FIG. 5. Each of the refrigerant discharging path 15-1 to 15-5 discharges the refrigerant that has passed through each of the discharge ports 132-1 to 132-5. The refrigerant is supplied from the plurality of heat dissipating plates 12-1 to 12-*n* to each of the plurality of refrigerant discharging path 15-1 to 15-5.

In other words, one supply port 131-1, one supply port 131-2, . . . , one supply port 131-5, one discharge port 132-1, one discharge port 132-2, . . . , and one discharge port 132-5 are arranged in a line in parallel to the longitudinal direction of one heat dissipating plate. The plurality of supply ports 131-1 are arranged below the refrigerant supplying path 14-1. The plurality of discharge ports 132-1 are arranged below the refrigerant discharging path 15-1. Similarly, the plurality of supply ports 131-2 are arranged below the refrigerant supplying path 14-2. The plurality of discharge ports 132-2 are arranged below the refrigerant discharging path 15-2. Although description is omitted, the other supply ports and the other discharge ports are similarly disposed below the other refrigerant supplying path and the other refrigerant discharging path.

As illustrated in FIG. 3, the discharge port 132-1 is provided adjacent to the supply port 131-1. The discharge port 132-1 is provided adjacent to the supply port 131-1 and the supply port 131-2. As described above, the supply ports 131-1 to 131-5 and the discharge ports 132-1 to 132-*n* of the refrigerant passing member 13 are alternately provided above each of the spaces surrounded by the heat receiving plate 11, the plurality of heat dissipating plates 12-1 to 12-*n*, and the refrigerant passing member 13. The supply ports 131-1 to 131-5 and the discharge ports 132-1 to 132-*n* may be provided alternately every other, every two, or every m (<5) above each convection chamber.

That is, at least one supply ports (in the present example embodiment, the supply ports 131-1 to 131-5) and at least one discharge ports (in the present example embodiment, the discharge ports 132-1 to 132-5) may be alternately provided in the cooling component 1.

Of the spaces surrounded by the heat receiving plate 11, each of the plurality of heat dissipating plates 12-1 to 12-*n*, and the refrigerant passing member 13, the space (in the second example embodiment and the third example embodiment, it is referred to as a convection chamber) surrounded by the heat dissipating plate 12-1 and the heat dissipating plate 12-2 will be represented, and the flow of the refrigerant and the heat reception will be described. The following explanation applies to the other convection chambers as well.

The refrigerant is supplied to the supply pipe 19 from the outside of the cooling component 1. As illustrated in FIG. 1, the refrigerant passes through the supply pipe 19 in a direction from the partition plate 17 toward the partition plate 18. The refrigerant supplied to the supply pipe 19 is distributed to each of the refrigerant supplying path 14-1 to 14-5. The distributed refrigerant passes through the refrigerant supplying path 14-1 to 14-5 in the direction from the supply pipe 19 toward the discharge pipe 20.

As illustrated in FIG. 3, the refrigerant is supplied from each of the supply ports 131-1 to 131-5 to the space surrounded by the heat dissipating plate 12-1 and the heat dissipating plate 12-2. As illustrated in FIG. 3, the through-holes are formed in the bottom surface of each of the refrigerant supplying path 14-1 to 14-5 at predetermined intervals in the longitudinal direction of the refrigerant supplying path 14-1 to 14-5. The through-holes formed at the predetermined intervals in the longitudinal direction of the refrigerant supplying path 14-1 to 14-5 are connected to the supply ports 131-1 to 131-5, respectively, that are through-holes formed in the refrigerant passing member 13. For example, a part of the refrigerant passing through the refrigerant supplying path 14-1 passes through one supply port 131-1 that is a through-hole of the refrigerant passing member 13, and is supplied to the space surrounded by the heat dissipating plate 12-1 and the heat dissipating plate 12-2.

In the example of the space surrounded by heat dissipating plate 12-1 and heat dissipating plate 12-2 of the cooling component 1 illustrated in FIGS. 1 to 5, heat generated from the cooling target object is transferred to the heat receiving plate 11, and is transferred from the heat receiving plate 11 to the heat dissipating plate 12-1, the heat dissipating plate 12-2, and the refrigerant. The heat transferred to the heat dissipating plate 12-1 and the heat dissipating plate 12-2 is also transferred to the refrigerant supplied to the space surrounded by the heat dissipating plate 12-1 and the heat dissipating plate 12-2. Then, the refrigerant is discharged to the outside of the space surrounded by the heat dissipating plate 12-1 and the heat dissipating plate 12-2 from each of the discharge ports 132-1 to 132-n adjacent to the supply ports 131-1 to 131-5 among the plurality of through-holes. The refrigerant discharged to the outside of the space surrounded by the heat dissipating plate 12-1 and the heat dissipating plate 12-2 is discharged to any one of the refrigerant discharging path 15-1 to 15-5.

As illustrated in FIG. 3, the through-holes are formed in the bottom surface of each of the refrigerant discharging path 15-1 to 15-5 at predetermined intervals in the longitudinal direction of the refrigerant discharging path 15-1 to 15-5. The through-holes formed at the predetermined intervals in the longitudinal direction of the refrigerant discharging path 15-1 to 15-5 are connected to the discharge ports 132-1 to 132-5 that are through-holes formed in the refrigerant passing member 13. For example, a part of the refrigerant supplied to the space surrounded by the heat dissipating plate 12-1 and the heat dissipating plate 12-2 passes through one discharge port 132-1 of the refrigerant passing member 13 and is discharged to the refrigerant discharging path 15-1.

The refrigerant discharged to any one of the refrigerant discharging path 15-1 to 15-5 passes through the discharge pipe 20 and is discharged to the outside of the cooling component 1.

The refrigerant is, for example, water. The refrigerant may be liquid or gas. When the refrigerant is water, the cooling component 1 is, for example, a cold plate for water cooling. Since water has a larger heat transport amount per unit weight than air, the cooling component 1 using water as the refrigerant can more efficiently cool the cooling target object than the case of air cooling. For example, the cooling component 1 is mounted in an information processing apparatus in order to cool a cooling target object in the information processing apparatus.

As illustrated in FIG. 4, the supply pipe 19 and the refrigerant supplying path 14-1 to 14-5 are formed in a comb-teeth shape. The discharge pipe 20 and the refrigerant discharging path 15-1 to 15-5 are formed in a comb-teeth shape. One of the plurality of refrigerant discharging path 15-1 to 15-5 is disposed respectively between adjacent two of the plurality of refrigerant supplying path 14-1 to 14-5.

As described above, in the first example embodiment of the present invention, the cooling component 1 includes the heat receiving plate 11 that receives heat from the cooling target object, and the plurality of heat dissipating plates 12-1 to 12-n disposed at predetermined intervals on the heat receiving plate 11. The cooling component 1 further includes the refrigerant supplying path 14-1 to 14-5 that supply the refrigerant to the plurality of heat dissipating plates 12-1 to 12-n, and the refrigerant discharging path 15-1 to 15-5 to which the refrigerant is supplied from the plurality of heat dissipating plates 12-1 to 12-n. The cooling component 1 includes the refrigerant passing member 13 having the plurality of through-holes through which the refrigerant passes. In the cooling component 1, the refrigerant supplied by the refrigerant supplying path 14-1 to 14-5 passes through some through-holes among the plurality of through-holes, and the refrigerant that has passed through the remainder of the plurality of through-holes is discharged by the refrigerant discharging path 15-1 to 15-5. In the cooling component 1, the through-holes among the plurality of through-holes and the remainder of the plurality of through-holes are adjacent to each other. As a result, the cooling component 1 can prevent the amount of the refrigerant supplied and per unit time and per unit area of the heat dissipating plates 12-1 to 12-n and the heat receiving plate 11 that receive heat from the cooling target object from being concentrated. In this manner, since the refrigerant is supplied in such a way as not to be concentrated onto predetermined portions of the heat dissipating plates 12-1 to 12-n and the heat receiving plate 11, it is possible to cool the cooling target object substantially uniformly.

Modification 1 of First Example Embodiment

In the cooling component 1 according to the first example embodiment, as illustrated in FIGS. 1 to 5, the refrigerant passing member 13 includes the plurality of supply ports 131-1 that are through-holes having a circular opening. In FIGS. 1 to 5, the plurality of supply ports 131-2 to 131-5 that are through-holes having an elliptical opening are formed in the refrigerant passing member 13. As illustrated in FIGS. 4 and 5, the openings of the plurality of supply ports 131-1 have a shorter length in the longitudinal direction of the openings than those of the openings of the plurality of supply ports 131-2 to 131-5. In the cooling component 1, the width of the refrigerant supplying path 14-1 in which the through-holes connected to the plurality of supply ports 131-1 are formed is shorter than the width of each of the refrigerant supplying path 14-2 to 14-5.

On the other hand, in a cooling component according to Modification 1 of the first example embodiment, widths of a plurality of refrigerant supplying path are equal. The width of the refrigerant supplying path is the length of each of upper surfaces of the refrigerant supplying path in the lateral direction of the upper surface. In the cooling component according to the present modification, through-holes of a refrigerant passing member facing the plurality of refrigerant supplying path may have the same size and the same shape. In the cooling component of the present modification, the width of each of the plurality of refrigerant supplying path may be equal to the width of at least any one of refrigerant discharging path, or may be different from the width of any one of the refrigerant discharging path.

Modification 2 of First Example Embodiment

In the cooling component 1 according to the first example embodiment, as illustrated in FIGS. 1 to 5, the refrigerant passing member 13 includes the plurality of discharge ports 132-5 that are through-holes having a circular opening. In FIGS. 1 to 5, the plurality of discharge ports 132-1 to 132-4 that are through-holes having an elliptical opening are formed in the refrigerant passing member 13. As illustrated in FIGS. 4 and 5, the openings of the plurality of discharge ports 132-5 have a shorter length in the longitudinal direction of the openings than those of the openings of the plurality of discharge ports 132-1 to 132-4. In the cooling component 1, the width of the refrigerant discharging path 15-5 in which the through-holes connected to the plurality of discharge ports 132-5 are formed is shorter than the width of each of the refrigerant discharging path 15-1 to 15-4.

Meanwhile, in a cooling component according to Modification 2 of the first example embodiment, widths of a plurality of refrigerant discharging path are equal. The width of the refrigerant discharging path is the length of each of upper surfaces of the refrigerant discharging path in the lateral direction of the upper surface. In the cooling component according to the present modification, through-holes of a refrigerant passing member facing the plurality of refrigerant discharging path may have the same size and the same shape. In the cooling component of the present modification, the width of each of the plurality of refrigerant discharging path may be equal to the width of at least any one of refrigerant supplying path, or may be different from the width of any one of the refrigerant supplying path.

In the cooling component of Modification 2, the widths of the plurality of refrigerant supplying path may be equal, and the widths of the plurality of refrigerant discharging path may be equal. When the widths of the plurality of refrigerant supplying path and the plurality of refrigerant discharging path are equal, the sizes of the through-holes of the refrigerant passing member may all be the same in the cooling component of Modification 2.

Modification 3 of First Example Embodiment

As illustrated in FIGS. 1 and 4, in the cooling component 1 of the first example embodiment, the refrigerant supplying path 14-1 to 14-5 and the refrigerant discharging path 15-1 to 15-5 are arranged in the direction orthogonal to the longitudinal direction of the heat dissipating plates 12-1 to 12-$n$.

In a cooling component according to Modification 3 of the first example embodiment, a plurality of refrigerant supplying path and a plurality of refrigerant discharging path are arranged in a predetermined direction that is not orthogonal to the longitudinal direction of each heat dissipating plate. In the cooling component according to Modification 3 of the first example embodiment, through-holes are formed at predetermined intervals in a refrigerant passing member at positions facing each of the plurality of refrigerant supplying path and the plurality of refrigerant discharging path.

Modification 4 of First Example Embodiment

In a cooling component according to Modification 4 of the first example embodiment, a refrigerant supplying path is provided for each of supply ports. For example, in the cooling component of the present modification, each of the refrigerant supplying path is provided such that the longitudinal direction of a flow path of the refrigerant supplying path is orthogonal to an upper surface of a refrigerant passing member. When the refrigerant supplying path is provided for each of the supply ports, in the cooling component of the present modification, one refrigerant supplying path supplies a refrigerant only to one supply port to which the refrigerant supplying path is connected. In the cooling component of the present modification, the same number of refrigerant supplying path as that of the supply ports provided in a space surrounded by predetermined heat dissipating plates are provided in the space surrounded by the predetermined heat dissipating plates.

In the cooling component according to the present modification, each of the plurality of refrigerant supplying path may be formed integrally with the refrigerant passing member.

Modification 5 of First Example Embodiment

In a cooling component according to Modification 5 of the first example embodiment, a refrigerant discharging path is provided for each of discharge ports. For example, in the cooling component of the present modification, each of the refrigerant discharging path is provided such that the longitudinal direction of a flow path of the refrigerant discharging path is orthogonal to an upper surface of a refrigerant passing member. When the refrigerant discharging path is provided for each of the discharge ports, in the cooling component of the present modification, one refrigerant discharging path supplies a refrigerant only to one discharge port to which the refrigerant discharging path is connected. In the cooling component of the present modification, the same number of refrigerant discharging path as that of the discharge ports provided in a space surrounded by predetermined heat dissipating plates are provided in the space surrounded by the predetermined heat dissipating plates.

In the cooling component according to the present modification, each of the plurality of refrigerant discharging path may be formed integrally with the refrigerant passing member.

In the cooling component of the present modification, the longitudinal direction of each of flow paths of refrigerant supplying path and each of the flow paths of the refrigerant discharging path may be orthogonal to the upper surface of the refrigerant passing member. In the cooling component according to the present modification, each of the plurality of refrigerant supplying path and each of the plurality of refrigerant discharging path may be formed integrally with the refrigerant passing member.

Modification 6 of First Example Embodiment

In a cooling component according to Modification 6 of the first example embodiment, a partition plate 17 and a partition plate 18 are formed integrally with a heat receiving plate 11 or a top plate 21.

Modification 7 of First Example Embodiment

In a cooling component according to Modification 7 of the first example embodiment, a heat receiving plate 11 and heat dissipating plates 12-1 to 12-$n$ are integrally formed.

Modification 8 of First Example Embodiment

A cooling component according to Modification 8 of the first example embodiment will be described with reference to FIGS. 6 and 7. In addition, since each configuration of the cooling component of the present modification is similar to each configuration of the cooling component 1 in the first example embodiment except for a refrigerant passing member 22 to be described later, corresponding elements are denoted by the same reference signs as those in FIGS. 1 to 5, and description of the elements is omitted.

Figure 6:
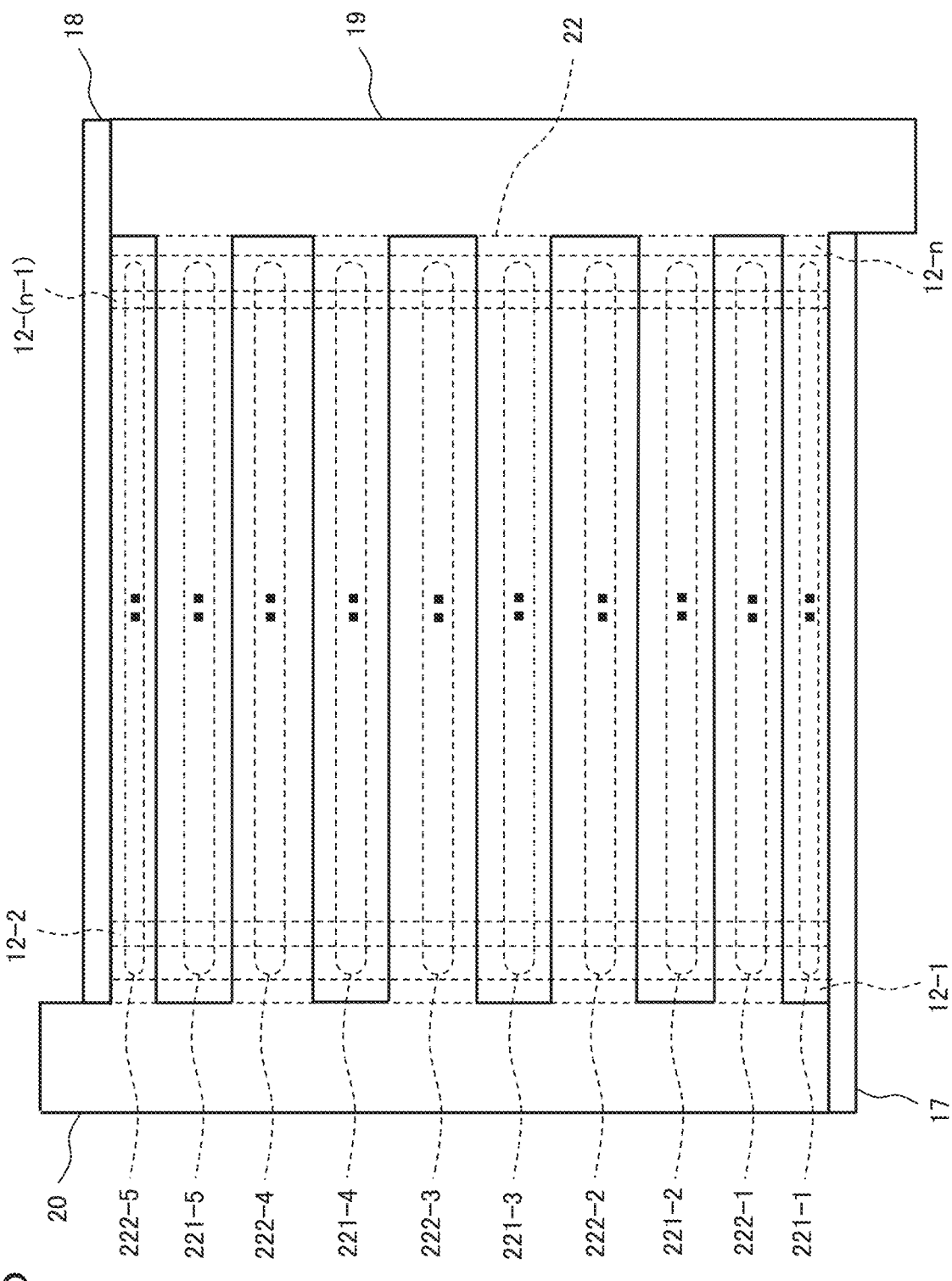
FIG. 6 is a top perspective view of a cooling component according to a modification of the first example embodiment of the present invention in a state where a top plate of the cooling component is removed.

FIG. 6 is a top perspective view of the cooling component according to the present modification in a state where a top plate 21 of the cooling component is removed. In FIG. 6, heat dissipating plates 12-1, 12-2, 12-($n$−1), and 12-$n$ are indicated by broken lines, and illustration of other heat dissipating plates 12-3 to 12-($n$−2) is omitted. FIG. 7 is a plan view illustrating a configuration example of the refrigerant passing member 22.

In the cooling component according to Modification 8 of the first example embodiment, supply ports 221-1, 221-2, 221-3, 221-4, and 221-5 that are through-holes are formed in the refrigerant passing member 22. Each of the supply ports 221-1 to 221-5 is provided for each of spaces surrounded by a heat receiving plate 11, each of the plurality of heat dissipating plates 12-1 to 12-$n$, and a refrigerant passing member 13, and is one through-hole having an elliptical opening formed in the refrigerant passing member 22 at a position facing a predetermined refrigerant supplying path. The longitudinal direction of the opening of each of the supply ports 221-1 to 221-5 is the same as the longitudinal direction of the upper surface of each of refrigerant supplying path 14-1 to 14-5. In the examples illustrated in FIGS. 6 and 7, the length of the opening of the supply port 221-1 in the lateral direction of the opening is shorter than the length of the opening of each of the supply ports 221-2 to 221-5 in the lateral direction of the opening. Lengths of the openings of the supply ports 221-1 to 221-5 in the lateral direction of the openings may be the same.

In the cooling component according to Modification 8, discharge ports 222-1, 222-2, 222-3, 222-4, and 222-5 that are through-holes are formed in the refrigerant passing member 22. Each of the discharge ports 222-1 to 222-5 is provided for each of the spaces surrounded by the heat receiving plate 11, each of the plurality of heat dissipating plates 12-1 to 12-$n$, and the refrigerant passing member 22, and is one through-hole having an elliptical opening formed in the refrigerant passing member 22 at a position facing a predetermined refrigerant discharging path. The longitudinal direction of the opening of each of the discharge ports 222-1 to 222-5 is the same as the longitudinal direction of the upper surface of each of refrigerant discharging path 15-1 to 15-5. In the examples illustrated in FIGS. 6 and 7, the length of the opening of the discharge port 222-5 in the lateral direction of the opening is shorter than the length of the opening of each of the discharge ports 222-1 to 222-4 in the lateral direction of the opening. Lengths of the openings of the discharge ports 222-1 to 222-5 in the lateral direction of the openings may be the same.

In the cooling component according to Modification 8 of the first example embodiment, through-holes are formed in the refrigerant passing member at positions facing each of the plurality of refrigerant supplying path and the plurality of refrigerant discharging path. That is, in the cooling component of the present modification, the through-holes of which the longitudinal directions of the openings are parallel to the longitudinal directions of the plurality of refrigerant supplying path and the plurality of refrigerant discharging path are formed at predetermined intervals in the refrigerant passing member.

The supply port 221-1 is disposed below the refrigerant supplying path 14-1. The discharge port 222-1 is disposed below the refrigerant discharging path 15-1. Similarly, the supply port 221-2 is disposed below the refrigerant supplying path 14-2. The discharge port 222-2 is disposed below the refrigerant discharging path 15-2. Although description is omitted, the other supply ports and the other discharge ports are similarly disposed below the other refrigerant supplying path and the other refrigerant discharging path.

Figure 7:
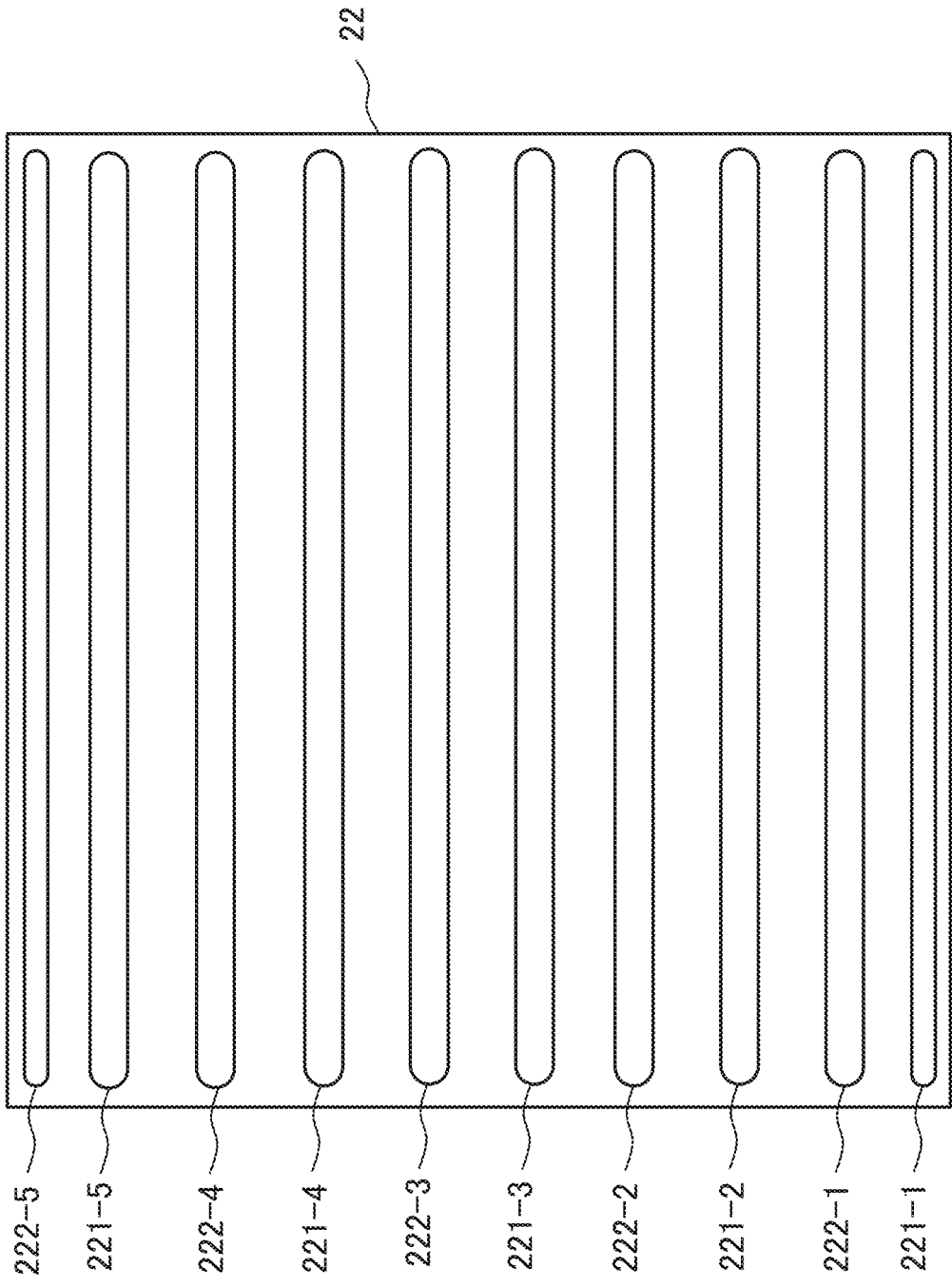
FIG. 7 is a plan view illustrating a configuration example of a refrigerant passing member of the cooling component according to the modification of the first example embodiment of the present invention.

As illustrated in FIGS. 6 and 7, each of the plurality of refrigerant supplying path 14-1 to 14-5 supplies the refrigerant to each of the plurality of heat dissipating plates 12-1 to 12-$n$ from some through-holes (in the present modification, the supply ports 221-1 to 221-5) among the plurality of through-holes (in the present modification, the supply ports 221-1 to 221-5 and the discharge ports 222-1 to 222-5).

As illustrated in FIGS. 6 and 7, each of the plurality of refrigerant discharging path 15-1 to 15-5 discharges the refrigerant that has passed through the remainder (in the present modification, the discharge ports 222-1 to 222-5) of the plurality of through-holes that is adjacent to the through-holes (in the present modification, the supply ports 221-1 to 221-5) among the plurality of the through-holes. The refrigerant is supplied from the plurality of heat dissipating plates 12-1 to 12-$n$ to each of the plurality of refrigerant discharging path 15-1 to 15-5.

The discharge port 222-1 is provided adjacent to the supply port 221-1 in each of the spaces surrounded by the heat receiving plate 11, the plurality of heat dissipating plates 12-1 to 12-$n$, and the refrigerant passing member 22. The discharge port 222-1 is provided adjacent to the supply port 221-1 and the supply port 221-2. As described above, the supply ports 221-1 to 221-5 and the discharge ports 222-1 to 222-$n$ of the refrigerant passing member 22 are alternately provided above each of the spaces surrounded by the heat receiving plate 11, the plurality of heat dissipating plates 12-1 to 12-$n$, and the refrigerant passing member 22.

Modification 9 of First Example Embodiment

In a cooling component according to Modification 9 of the first example embodiment, a refrigerant passing member 13, refrigerant supplying path 14-1 to 14-5, and refrigerant discharging path 15-1 to 15-5 are integrally formed.

Second Example Embodiment

A cooling component 3 according to the second example embodiment of the present invention will be described with reference to FIGS. 8 to 13.

Figure 8:
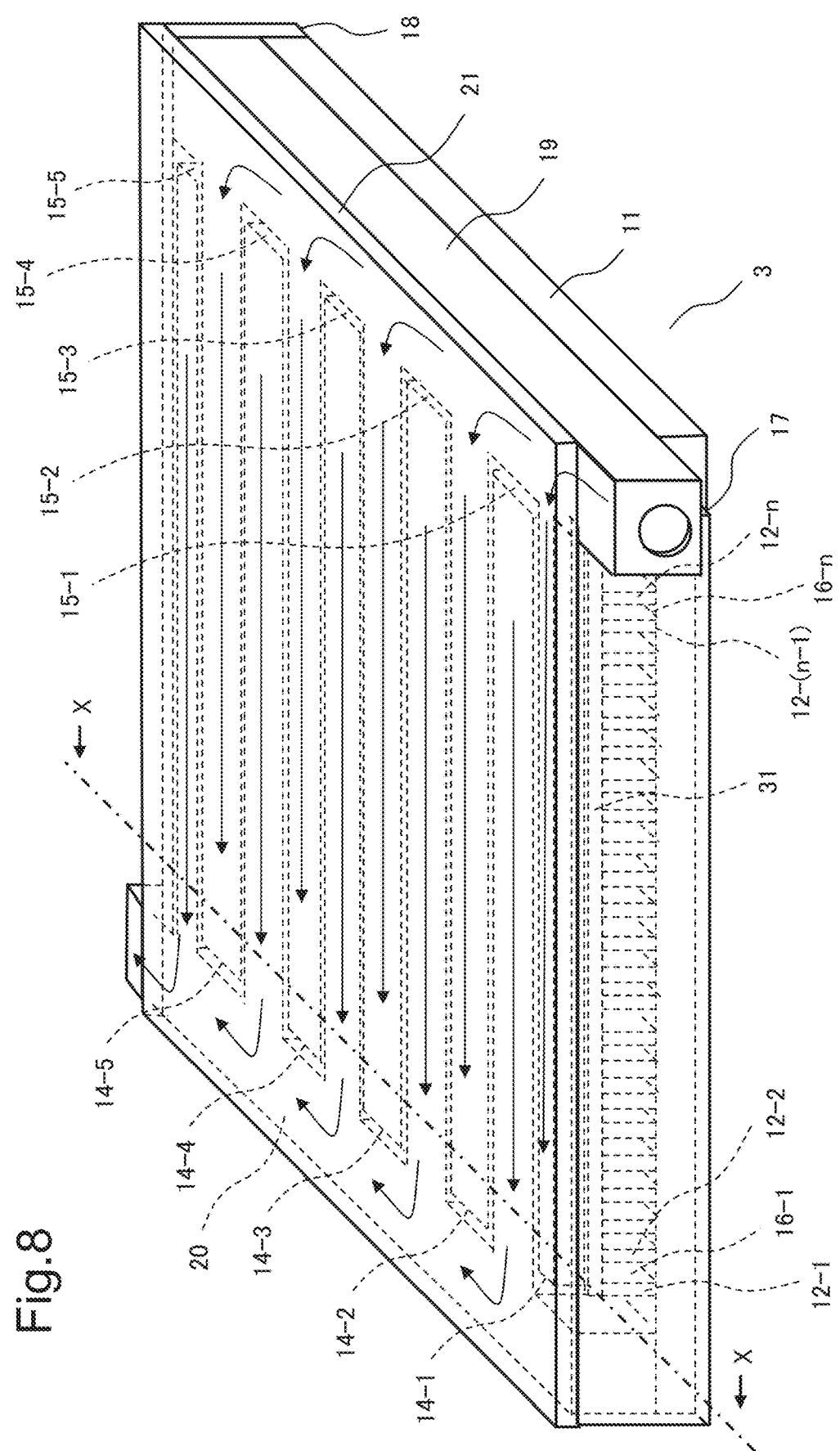
FIG. 8 is a transparent perspective view illustrating a configuration example of a cooling component according to a second example embodiment of the present invention.
Figure 9:
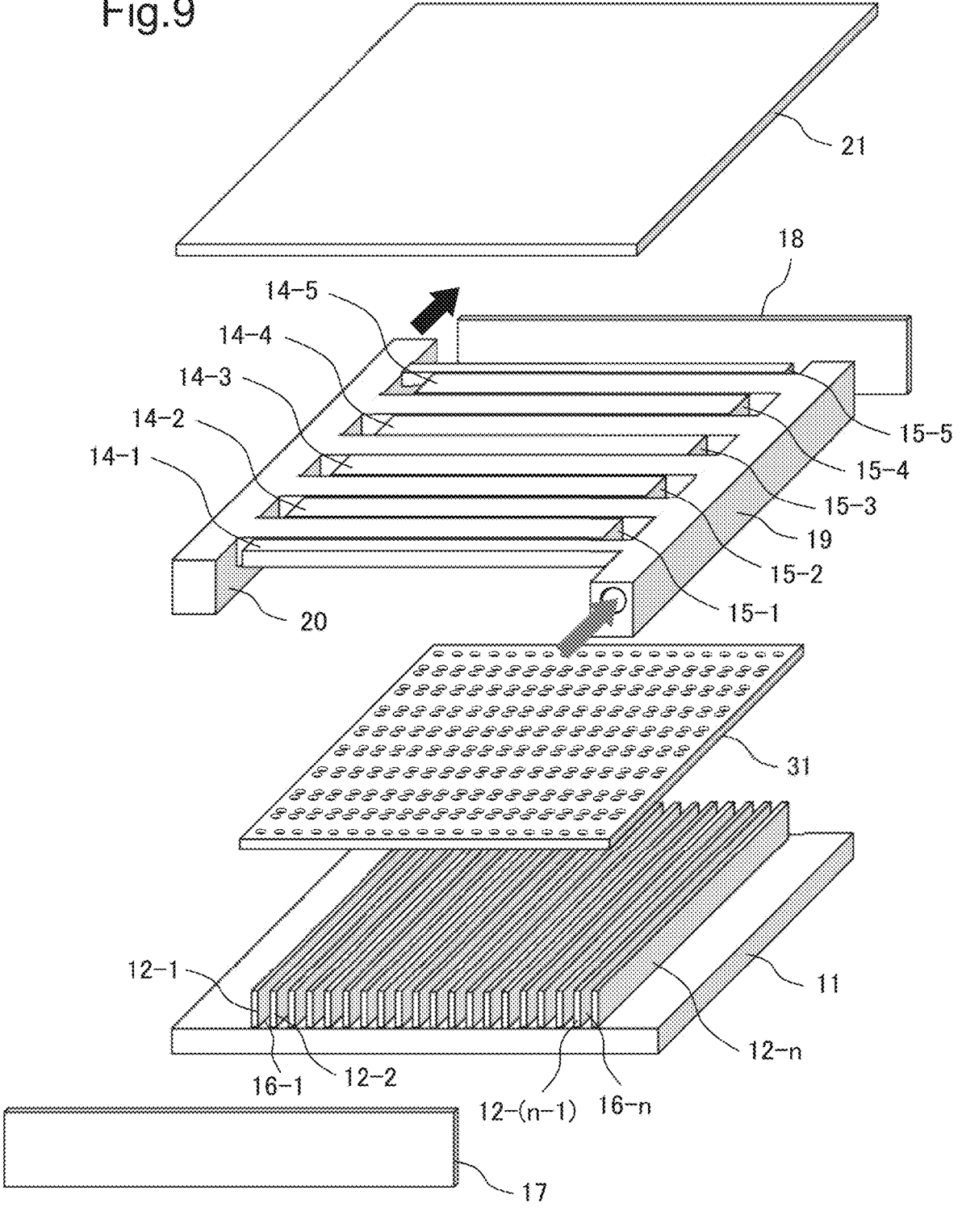
FIG. 9 is an exploded perspective view of the cooling component according to the second example embodiment of the present invention.
Figure 10:
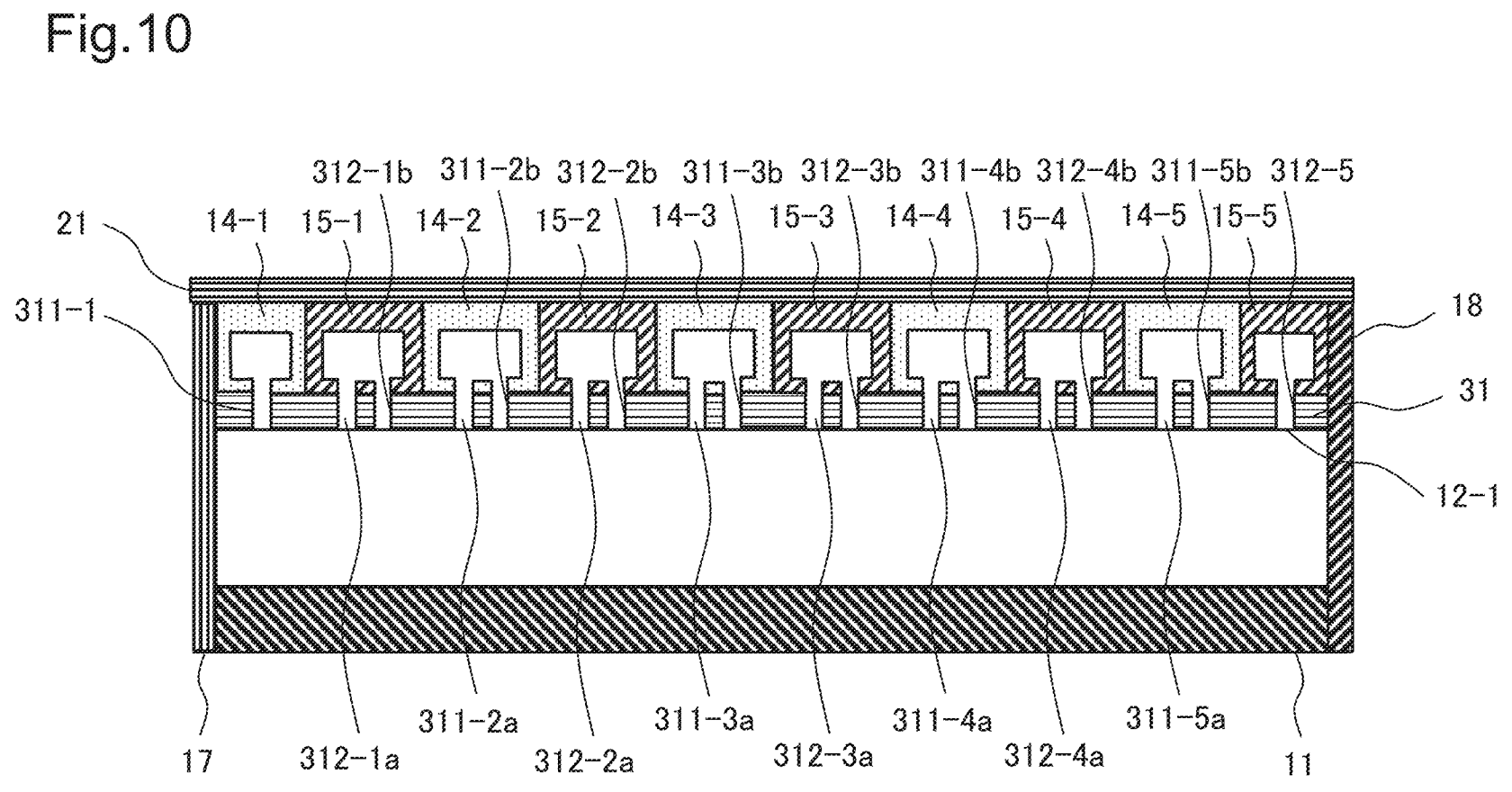
Figure 11:
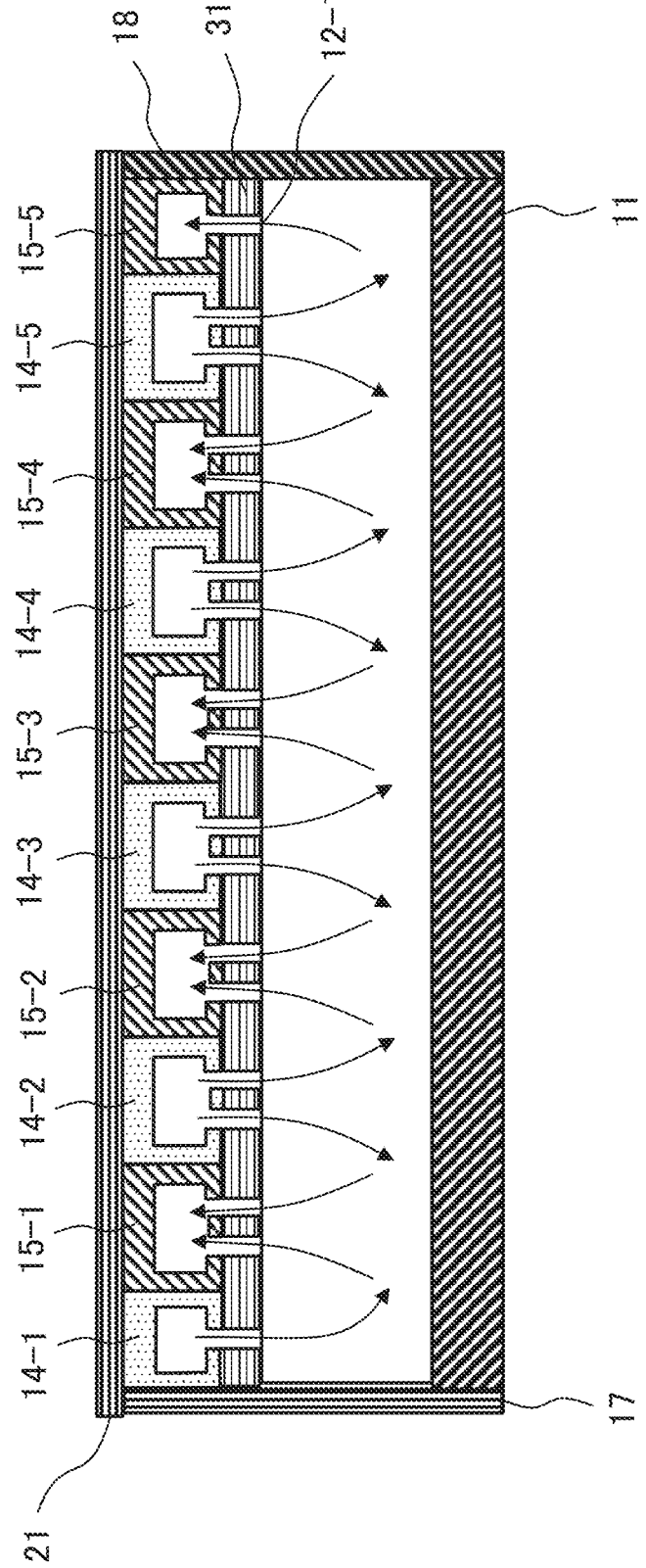
FIG. 11 is a schematic view schematically illustrating a direction in which a refrigerant flows using the cross-sectional view in the cooling component according to the second example embodiment of the present invention.

FIG. 8 is a transparent perspective view illustrating a configuration example of the cooling component 3 according to the present example embodiment. FIG. 9 is an exploded perspective view of the cooling component 3 illustrated in FIG. 8. FIG. 10 is a cross-sectional view of the cooling component 3 taken along line X-X in FIG. 8. FIG. 11 is a schematic view schematically illustrating a direction in which a refrigerant flows using the cross-sectional view (FIG. 10) of the cooling component 3 taken along line X-X in FIG. 8. Arrows in FIGS. 8 to 11 schematically indicate directions in which the refrigerant flows. In FIG. 8, line X-X is illustrated between a heat dissipating plate 12-1 and a heat dissipating plate 12-2 and at a position where a convection chamber 16-1 is cut.

The cooling component 3 according to the second example embodiment is different from the cooling component 1 according to the first example embodiment illustrated in FIGS. 1 to 5 in that one predetermined refrigerant supplying path supplies a refrigerant from two supply ports to one predetermined convection chamber. The cooling component 3 according to the second example embodiment is different from the cooling component 1 according to the first example embodiment illustrated in FIGS. 1 to 5 in that one predetermined refrigerant discharging path discharges, from two discharge ports, the refrigerant supplied to one predetermined convection chamber. In other words, the cooling component 3 according to the second example embodiment is different from the cooling component 1 according to the first example embodiment illustrated in FIGS. 1 to 5 in that supply ports and discharge ports are provided alternately every two above each convection chamber.

A heat receiving plate 11, heat dissipating plates 12-1 to 12-n, refrigerant supplying path 14-1 to 14-5, refrigerant discharging path 15-1 to 15-5, a partition plate 17, a partition plate 18, a supply pipe 19, a discharge pipe 20, and a top plate 21 of the cooling component 3 have the same configurations as those of the cooling component 1 according to the first example embodiment, and thus, the same reference signs as those in FIGS. 1 to 4 are given to the corresponding elements, and the common description will be omitted.

Convection chambers 16-1 to 16-n (n is an integer equal to or more than 2) are formed along the heat dissipating plates 12-1 to 12-n, respectively. The heat receiving plate 11 is disposed at bottoms of the convection chambers 16-1 to 16-n. A refrigerant passing member 31 is disposed above the convection chambers 16-1 to 16-n. The convection chambers 16-1 to 16-n are, for example, microchannels.

As illustrated in FIGS. 8 to 11, the cooling component 3 according to the present example embodiment includes the plurality of refrigerant supplying path 14-1 to 14-5 disposed on the refrigerant passing member 31 and a plurality of refrigerant discharging path 15-1 to 15-5 disposed on the refrigerant passing member 31.

Figure 12:
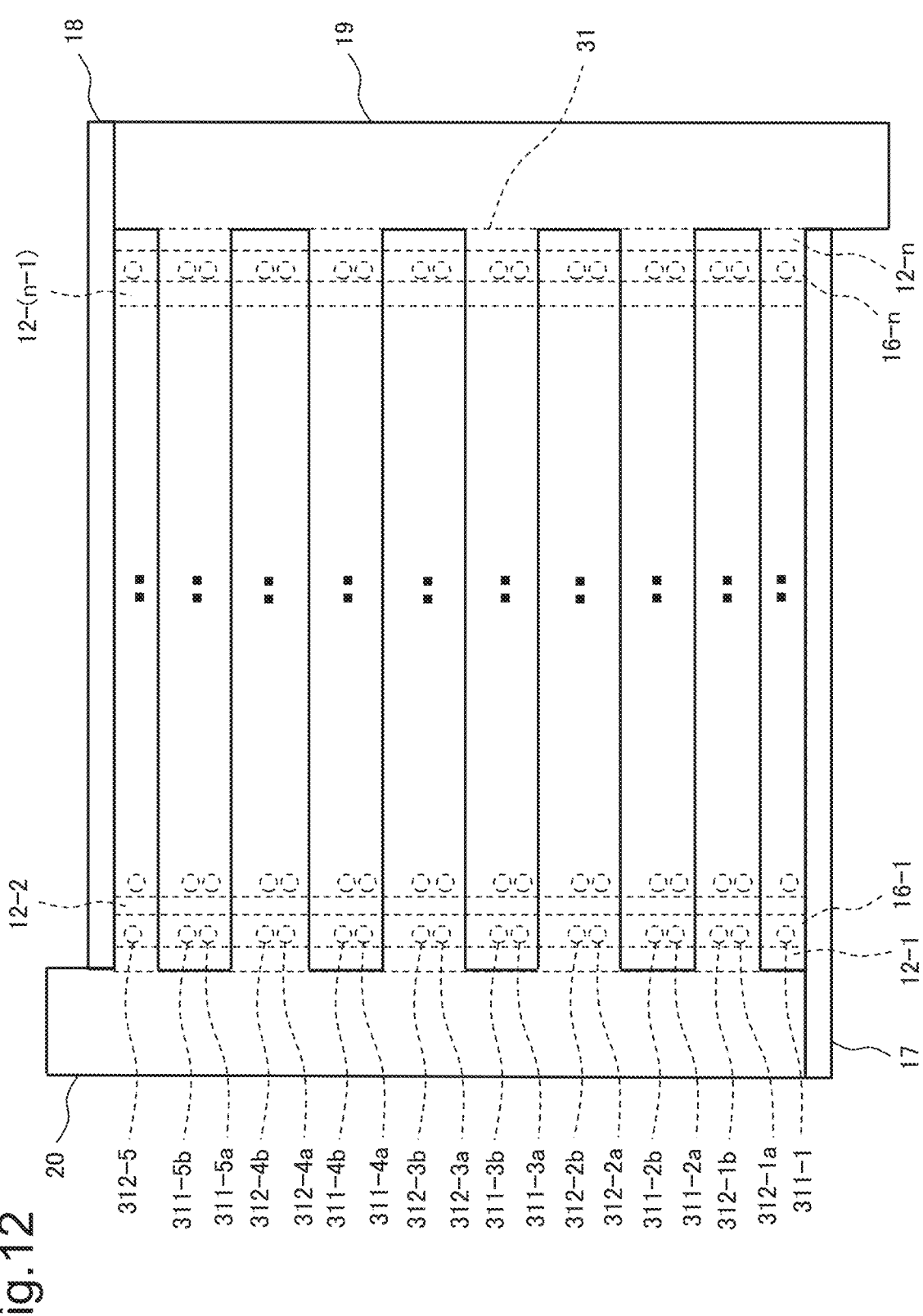
FIG. 12 is a top perspective view of the cooling component according to the second example embodiment of the present invention in a state where a top plate of the cooling component is removed.

FIG. 12 is a top perspective view of the cooling component 3 illustrated in FIG. 8 in a state where the top plate 21 of the cooling component 3 is removed. In FIG. 12, the refrigerant passing member 31 and the heat dissipating plates 12-1, 12-2, 12-(n−1), and 12-n are indicated by broken lines, and illustration of the other heat dissipating plates 12-3 to 12-(n−2) is omitted.

Figure 13:
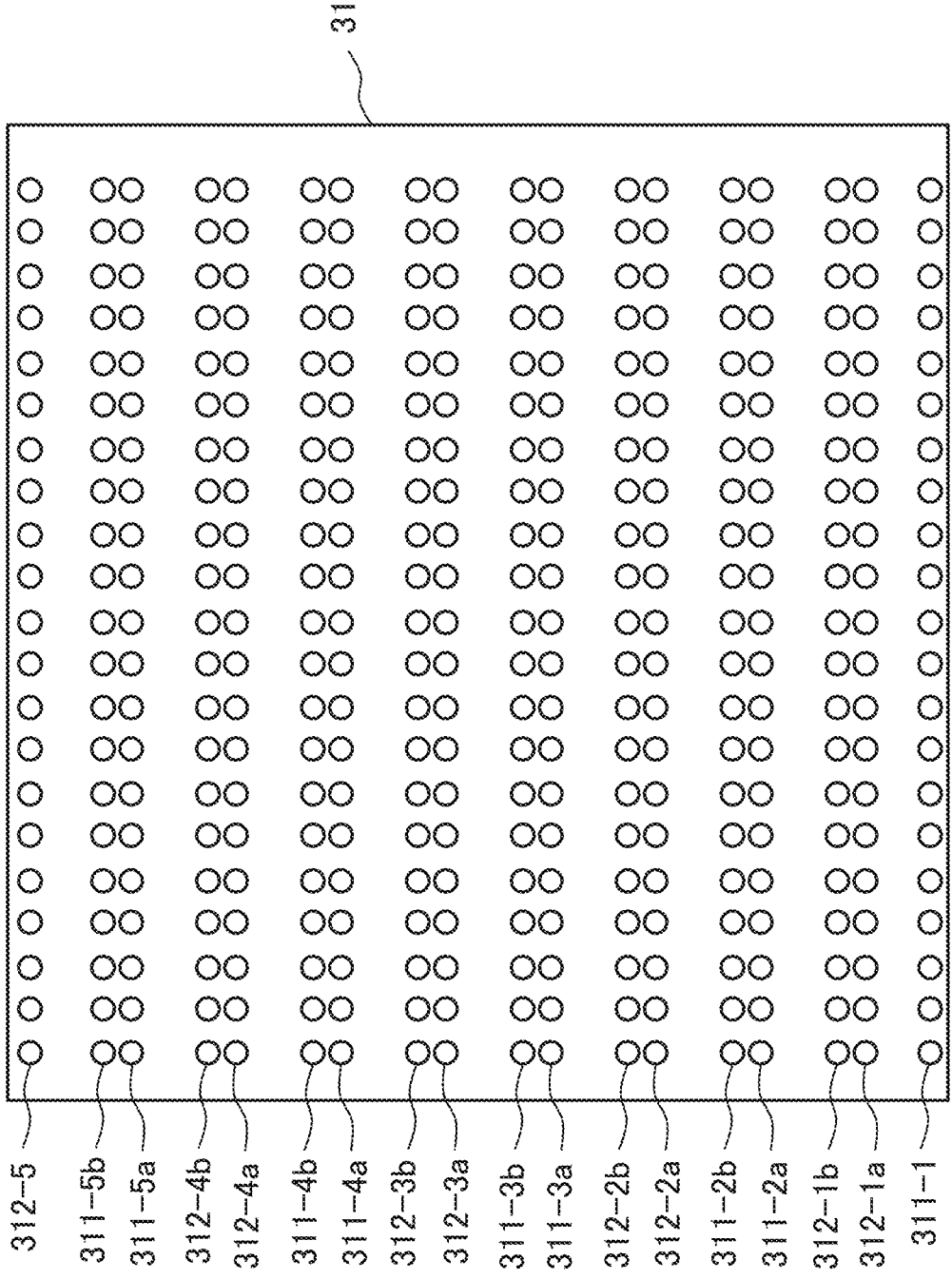
FIG. 13 is a plan view illustrating a configuration example of a refrigerant passing member of the cooling component according to the second example embodiment of the present invention.

FIG. 13 is a plan view illustrating a configuration example of the refrigerant passing member 31. A flow path inside each of the refrigerant supplying path 14-1 to 14-5 is connected to each of some through-holes (in the present example embodiment, the supply ports 311-1, 311-2a, 311-2b, . . . , 311-5a, and 311-5b) among the plurality of through-holes of the refrigerant passing member 31 illustrated in FIG. 13. Each of the refrigerant supplying path 14-1 to 14-5 supplies the refrigerant from the supply pipe 19 to each of the plurality of heat dissipating plates 12-1 to 12-n through each of the supply ports 311-1 and 311-2a to 311-5b. Meanwhile, a flow path inside each of the refrigerant discharging path 15-1 to 15-5 is connected to the remainder (in the present example embodiment, the discharge ports 312-1a, 312-1b, . . . , and 312-5) of the plurality of through-holes that is adjacent to the through-holes (in the present example embodiment, the supply ports 311-1 and 311-2a to 311-5b) among the plurality of through-holes of the refrigerant passing member 31 illustrated in FIG. 13. Each of the refrigerant discharging path 15-1 to 15-5 discharges the refrigerant that has passed through each of the discharge ports 312-1a to 312-4b and 312-5.

Each of the convection chambers 16-1 to 16-n is provided with the plurality of supply ports 311-1 and 311-2a to 311-5b to which the refrigerant is supplied from any one of the refrigerant supplying path 14-1 to 14-5, and the plurality of discharge ports 312-1a to 312-4b and 312-5 from which the refrigerant is discharged to the refrigerant discharging path 15-1 to 15-5. As illustrated in FIG. 13, in the refrigerant passing member 31, the sizes and shapes of the openings of the plurality of supply ports 311-1 and 311-2a to 311-5b and the plurality of discharge ports 312-1a to 312-4b and 312-5 are the same. In the refrigerant passing member 31, the openings of the plurality of supply ports 311-1 and 311-2a to 311-5b and the plurality of discharge ports 312-1a to 312-4b and 312-5 have circular shapes.

The sizes and shapes of the openings of the plurality of supply ports 311-1 and 311-2a to 311-5b and the plurality of discharge ports 312-1a to 312-4b and 312-5 are the same.

The plurality of supply ports is, for example, a plurality of through-holes provided for each of the convection chambers 16-1 to 16-n and formed in the refrigerant passing member 31 in a direction orthogonal to the longitudinal direction of the heat dissipating plates 12-1 to 12-n and at positions facing predetermined refrigerant supplying path. For example, the plurality of supply ports 311-2a are a plurality of through-holes provided at positions facing the refrigerant supplying path 14-2 for each of the convection chambers 16-1 to 16-n. The plurality of supply ports 311-2b are a plurality of through-holes provided at positions facing the refrigerant supplying path 14-2 for each of the convection chambers 16-1 to 16-n. As described above, the refrigerant passing member 31 is provided with sets of two ports of the plurality of supply ports at positions facing each of the refrigerant supplying path 14-2 to 14-5. The refrigerant passing member 31 is provided with one set of the plurality of supply ports (supply ports 311-1 illustrated in FIGS. 12 and 13) at positions facing the refrigerant supplying path 14-1. The refrigerant supplying path 14-1 facing the plurality of supply ports of the one set has an upper surface with a shorter width in the lateral direction of the upper surface than that of each of the refrigerant supplying path 14-2 to 14-5 facing the plurality of supply ports of the two sets.

Similarly to the plurality of supply ports, the plurality of discharge ports is, for example, a plurality of through-holes provided in the refrigerant passing member 31 at positions facing the predetermined refrigerant discharging path in the direction orthogonal to the longitudinal direction of the heat dissipating plates 12-1 to 12-n provided for each of the convection chambers 16-1 to 16-n. As described above, the refrigerant passing member 31 is provided with sets of two ports of the plurality of discharge ports at positions facing each of the refrigerant discharging path 15-1 to 15-4. The refrigerant passing member 31 is provided with one set of the plurality of discharge ports (discharge ports 312-5 illustrated in FIGS. 12 and 13) at positions facing the refrigerant discharging path 15-5. The refrigerant discharging path 15-5 facing the plurality of discharge ports of the one set has an upper surface with a shorter width in the lateral direction of the upper surface than that of each of the refrigerant discharging path 15-1 to 15-4 facing the plurality of discharge ports of the two sets.

The plurality of supply ports 311-1 and 311-2a to 311-5b and the plurality of discharge ports 312-1a to 312-4b and 312-5 are provided alternately every two in the longitudinal direction of the heat dissipating plates 12-1 to 12-n.

For example, one supply port 311-1, . . . , one supply port 311-5a, one supply port 311-5b, one discharge port 312-1a, one discharge port 312-1b, . . . , and one discharge port 312-5 are arranged in parallel and in a line in the longitudinal direction of one heat dissipating plate. The plurality of supply ports 311-1 are arranged below the refrigerant supplying path 14-1. The plurality of discharge ports 312-1a and the plurality of discharge ports 312-1b are arranged below the refrigerant discharging path 15-1. Similarly, the plurality of supply ports 311-2a and the plurality of supply ports 311-2b are arranged below the refrigerant supplying path 14-2. The plurality of discharge ports 312-2a and the plurality of discharge ports 312-2b are arranged below the refrigerant discharging path 15-2. Although description is omitted, the other supply ports and the other discharge ports are similarly disposed below the other refrigerant supplying path and the other refrigerant discharging path.

As illustrated in FIGS. 10 and 11, the convection chamber 16-1 is provided with the discharge port 312-1a adjacent to the supply port 311-1. The discharge port 312-1a is provided adjacent to the supply port 311-1 and the discharge port 312-1b. The supply port 311-2a is provided adjacent to the discharge port 312-1b and the supply port 311-2b. As described above, the supply ports 311-1 and 311-2a to 311-5b and the discharge ports 312-1a to 312-4b and 312-5 of the refrigerant passing member 31 are provided alternately every two above the convection chambers 16-1 to 16-n.

The flow of the refrigerant and the heat reception will be described using the convection chamber 16-1 among the convection chambers 16-1 to 16-n as a representative. The following explanation applies to the other convection chambers as well.

The refrigerant is supplied to the supply pipe 19 from the outside of the cooling component 3. As illustrated in FIG. 8, the refrigerant passes through the supply pipe 19 in a direction from the partition plate 17 toward the partition plate 18. The refrigerant supplied to the supply pipe 19 is distributed to each of the refrigerant supplying path 14-1 to 14-5. The distributed refrigerant passes through the refrigerant supplying path 14-1 to 14-5 in the direction from the supply pipe 19 toward the discharge pipe 20.

As illustrated in FIG. 11, the refrigerant is supplied from each of supply ports 311-1 and 311-2a to 311-5b to the convection chamber 16-1. As illustrated in FIGS. 10 and 11, the through-holes are formed in the bottom surface of each of the refrigerant supplying path 14-1 to 14-5 at predetermined intervals in the longitudinal direction of the refrigerant supplying path 14-1 to 14-5. The through-holes formed at the predetermined intervals in the longitudinal direction of the refrigerant supplying path 14-1 to 14-5 are connected to the supply ports 311-1 and 311-2a to 311-5b that are through-holes formed in the refrigerant passing member 31. For example, a part of the refrigerant passing through the refrigerant supplying path 14-1 passes through one supply port 311-1 that is a through-hole of the refrigerant passing member 31, and is supplied to the convection chamber 16-1. For example, a part of the refrigerant passing through the refrigerant supplying path 14-2 passes through one supply port 311-2a or one supply port 311-2b that is a through-hole of the refrigerant passing member 31, and is supplied to the convection chamber 16-1.

In the example of the convection chamber 16-1 of the cooling component 3 illustrated in FIGS. 8 to 13, heat generated from the cooling target object is transferred to the heat receiving plate 11, and is transferred from the heat receiving plate 11 to the heat dissipating plate 12-1, the heat dissipating plate 12-2, and the refrigerant. The heat transferred to the heat dissipating plate 12-1 and the heat dissipating plate 12-2 is also transferred to the refrigerant convectively flowing in the convection chamber 16-1. The refrigerant is discharged to the outside of the convection chamber 16-1 from each of discharge ports 312-1a to 312-4b and 312-5 adjacent to each of the supply ports 311-1 and 311-2a to 311-5b among the plurality of through-holes. The refrigerant discharged to the outside of the convection chamber 16-1 is discharged to any one of the refrigerant discharging path 15-1 to 15-5.

As illustrated in FIGS. 10 and 11, the through-holes are formed in the bottom surface of each of the refrigerant discharging path 15-1 to 15-5 at predetermined intervals in the longitudinal direction of the refrigerant discharging path 15-1 to 15-5. The through-holes formed at the predetermined intervals in the longitudinal direction of the refrigerant discharging path 15-1 to 15-5 are connected to the discharge ports 312-1a to 312-4b and 312-5 that are through-holes formed in the refrigerant passing member 31. For example, a part of the refrigerant supplied to the convection chamber 16-1 passes through one discharge port 312-1a or one discharge port 312-1b of the refrigerant passing member 31 and is discharged to the refrigerant discharging path 15-1.

The refrigerant discharged to any one of the refrigerant discharging path 15-1 to 15-5 passes through the discharge pipe 20 and is discharged to the outside of the cooling component 3.

As described above, in the second example embodiment of the present invention, the cooling component 3 includes the heat receiving plate 11 that receives heat from the cooling target object, and the plurality of heat dissipating plates 12-1 to 12-n disposed at predetermined intervals on the heat receiving plate 11. The cooling component 3 further includes the refrigerant supplying path 14-1 to 14-5 that supply the refrigerant to the plurality of heat dissipating plates 12-1 to 12-n, and the refrigerant discharging path 15-1 to 15-5 to which the refrigerant is supplied from the plurality of heat dissipating plates 12-1 to 12-n. The cooling component 3 includes the refrigerant passing member 31 having the plurality of through-holes through which the refrigerant passes. In the cooling component 3, the refrigerant supplied by the refrigerant supplying path 14-1 to 14-5 passes through some through-holes among the plurality of through-holes, and the refrigerant that has passed through the remainder of the plurality of through-holes is discharged by the refrigerant discharging path 15-1 to 15-5. In the cooling component 3, the through-holes among the plurality of through-holes and the remainder of the plurality of through-holes are adjacent to each other. As a result, the cooling component 3 can prevent the amount of the refrigerant supplied per unit time and per unit area of the heat dissipating plates 12-1 to 12-n and the heat receiving plate 11 that receive heat from the cooling target object from being concentrated. In this manner, since the refrigerant is supplied in such a way as not to be concentrated onto predetermined portions of the heat dissipating plates 12-1 to 12-n and the heat receiving plate 11, it is possible to cool the cooling target object substantially uniformly.

In the cooling component 3 of the present example embodiment, in the refrigerant passing member 31, the openings of the plurality of supply ports 311-1 and 311-2a to 311-5b and the plurality of discharge ports 312-1a to 312-4b and 312-5 are circular in shape and equal in size. By providing two supply ports at positions facing one predetermined refrigerant supplying path for one predetermined convection chamber, in the cooling component 3, for example, the flow velocity of the refrigerant flowing into the predetermined convection chamber becomes higher than that in the cooling component 1 of the first example embodiment. This is because the area of the opening of each supply port is narrower in a case where the supply port is provided as two supply ports than in a case where one supply port connecting two supply ports is provided (for example, the cooling component 1 of the first example embodiment), and thus the flow path is partially narrowed. When the flow path becomes narrower, the flow velocity becomes higher, and thus the flow velocity of the refrigerant supplied to the convection chamber becomes higher in a case where each supply port is provided as two supply ports than in a case where one supply port connecting two supply ports is provided. As described above, since the cooling component 3 supplies the refrigerant that flows at a higher flow speed than that in the cooling component 1 to the heat dissipating plates 12-1 to 12-$n$ and the heat receiving plate 11 that receive heat from the cooling target object, the cooling performance is improved as compared with the cooling component 1.

Modification 1 of Second Example Embodiment

In a cooling component according to Modification 1 of the second example embodiment, widths of a plurality of refrigerant supplying path are equal. The width of the refrigerant supplying path is the length of each of upper surfaces of the refrigerant supplying path in the lateral direction of the upper surface. Further, in the cooling component of the present modification, the sizes and shapes of through-holes of a refrigerant passing member facing each of the plurality of refrigerant supplying path, and the number of sets of a plurality of through-holes facing a predetermined refrigerant supplying path may be the same.

Modification 2 of Second Example Embodiment

In a cooling component according to Modification 2 of the second example embodiment, the widths of a plurality of refrigerant discharging path are equal. The width of the refrigerant discharging path is the length of each of upper surfaces of the refrigerant discharging path in the lateral direction of the upper surface. Further, in the cooling component of the present modification, the sizes and shapes of through-holes of a refrigerant passing member facing each of the plurality of refrigerant discharging path, and the number of sets of a plurality of through-holes facing a predetermined refrigerant discharging path may be the same.

In the cooling component of Modification 2, the width of each of the plurality of refrigerant discharging path and the width of each of the plurality of refrigerant supplying path may be equal. In this case, in the cooling component according to the present modification, each of a second number of discharge ports may be provided between adjacent two of a first number of supply ports above a predetermined convection chamber among a plurality of convection chambers, the first number is at least one, the second number is at least one, and the first number may be equal to the second number. Specifically, in the cooling component of the present modification, the number of sets of a plurality of through-holes facing each of the plurality of refrigerant supplying path and the number of sets of through-holes facing each of the plurality of refrigerant discharging path may be the same.

Modification 3 of Second Example Embodiment

A cooling component according to Modification 3 of the second example embodiment will be described with reference to FIGS. 14 and 15. In addition, since each configuration of the cooling component of the present modification is similar to each configuration of the cooling component 3 in the second example embodiment except for a refrigerant passing member 32 to be described later, corresponding elements are denoted by the same reference signs as those in FIGS. 8 to 13, and description of the elements is omitted.

Figure 14:
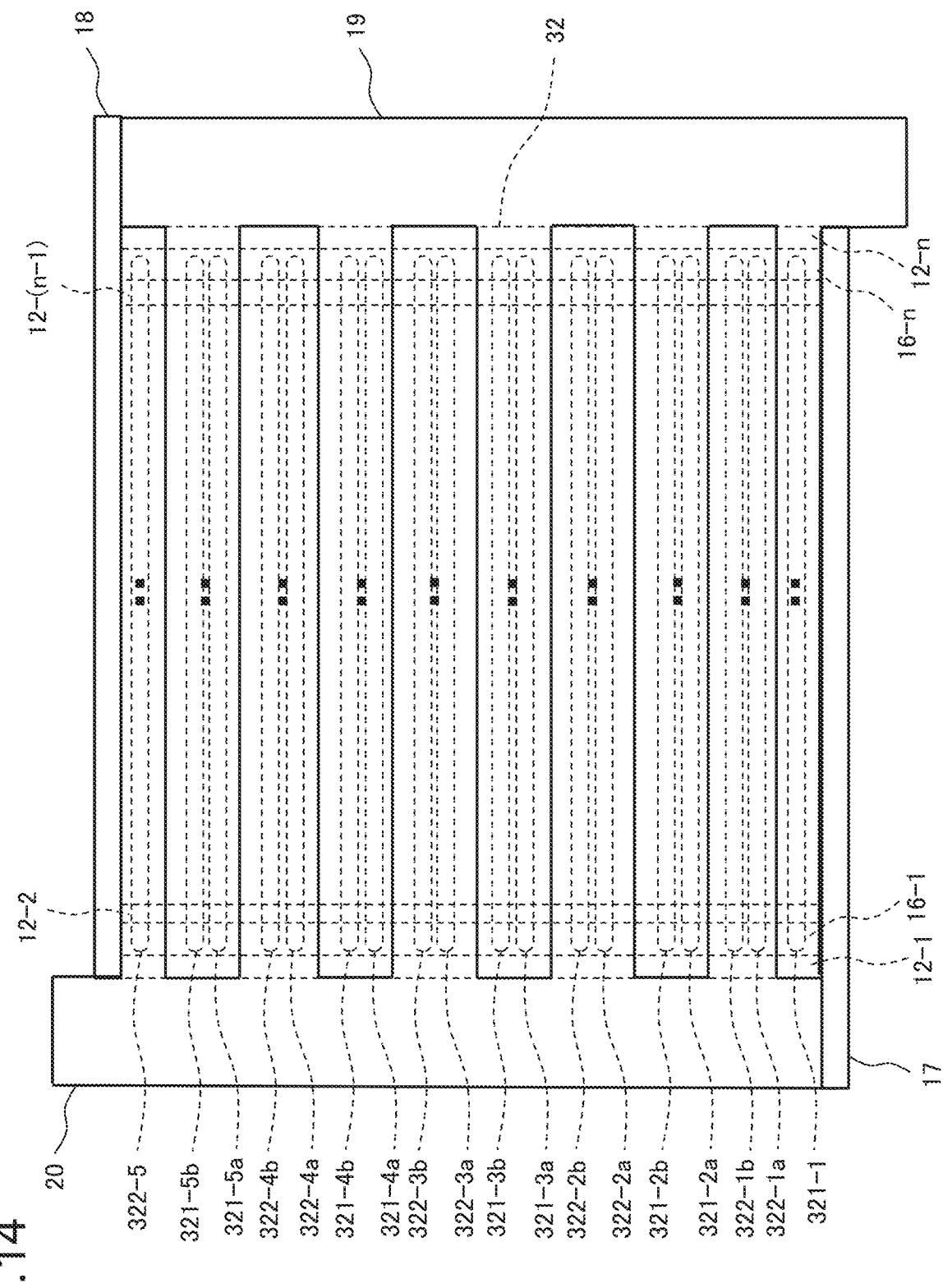
FIG. 14 is a top perspective view of a cooling component according to a modification of the second example embodiment of the present invention in a state where a top plate of the cooling component is removed.

FIG. 14 is a top perspective view of the cooling component according to the present modification in a state where a top plate 21 of the cooling component is removed. In FIG. 14, heat dissipating plates 12-1, 12-2, 12-($n$–1), and 12-$n$ are indicated by broken lines, and illustration of other heat dissipating plates 12-3 to 12-($n$–2) is omitted. FIG. 15 is a plan view illustrating a configuration example of the refrigerant passing member 32.

In the cooling component according to Modification 3 of the second example embodiment, supply ports 321-1, 321-2$a$, 321-2$b$, . . . , 321-5$a$, and 321-5$b$ that are through-holes are formed in the refrigerant passing member 32. Each of the supply ports 321-1, 321-2$a$ to 321-5$b$ is one through-hole provided for each of the convection chambers 16-1 to 16-$n$, is formed in the refrigerant passing member 32 at a position facing a predetermined refrigerant supplying path, and has an elliptical opening. The longitudinal direction of the opening of each of the supply ports 321-1, 321-2$a$ to 321-5$b$ is the same as the longitudinal direction of an upper surface of each of refrigerant supplying path 14-1 to 14-5.

The supply port 321-2$a$ is a through-hole provided in the refrigerant passing member 32 at a position facing the refrigerant supplying path 14-2 for each of the convection chambers 16-1 to 16-$n$. The supply port 321-2$b$ is a through-hole provided in the refrigerant passing member 32 at a position facing the refrigerant supplying path 14-2 for each of the convection chambers 16-1 to 16-$n$. As described above, the refrigerant passing member 32 is provided with two supply ports at positions facing each of the refrigerant supplying path 14-2 to 14-5. The refrigerant passing member 32 is provided with one supply port (supply port 321-1 illustrated in FIGS. 14 and 15) at a position facing the refrigerant supplying path 14-1. The refrigerant supplying path 14-1 facing one supply port has an upper surface with a shorter width in the lateral direction of the upper surface than that of each of the refrigerant supplying path 14-2 to 14-5 each of which faces two supply ports. In the examples illustrated in FIGS. 14 and 15, the lengths of the openings of the supply ports 321-1 and 321-2$a$ to 321-5$b$ in the lateral direction of the openings are equal. In the examples illustrated in FIGS. 14 and 15, the lengths of the openings of the supply ports 321-1 and 321-2$a$ to 321-5$b$ in the longitudinal direction of the openings are equal.

In the cooling component according to Modification 3, discharge ports 322-1$a$, 322-1$b$, . . . , and 322-5 that are through-holes are formed in the refrigerant passing member 32. Each of the discharge ports 322-1$a$ to 322-4$b$ and 322-5 is one through-hole provided for each of the convection chambers 16-1 to 16-$n$, is formed in the refrigerant passing member 32 at a position facing a predetermined refrigerant discharging path, and has an elliptical opening. The longitudinal direction of the opening of each of the discharge ports 322-1$a$ to 322-4$b$ and 322-5 is the same as the longitudinal direction of the upper surface of each of the refrigerant discharging path 15-1 to 15-5.

The discharge port 322-1$a$ is a through-hole provided in the refrigerant passing member 32 at a position facing the refrigerant discharging path 15-1 for each of the convection chambers 16-1 to 16-$n$. The discharge port 322-1$b$ is a through-hole provided in the refrigerant passing member 32 at a position facing the refrigerant discharging path 15-1 for each of the convection chambers 16-1 to 16-$n$. In this manner, the refrigerant passing member 32 is provided with two discharge ports at positions facing one predetermined refrigerant discharging path. The refrigerant passing member 32 is provided with one discharge port (discharge port 322-5 illustrated in FIGS. 14 and 15) at a position facing the refrigerant discharging path 15-5. In addition, the refrigerant discharging path 15-5 facing one discharge port has an upper surface with a shorter width in the lateral direction of the upper surface than that of each of the refrigerant discharging path 15-1 to 15-4 each of which faces two discharge ports. In the examples illustrated in FIGS. 14 and 15, the lengths of the openings of the discharge ports 322-1*a* to 322-4*b* and 322-5 in the lateral direction of the openings are equal. In the examples illustrated in FIGS. 14 and 15, the lengths of the openings of the discharge ports 322-1*a* to 322-4*b* and 322-5 in the longitudinal direction of the openings are equal.

The supply port 321-1 is disposed below the refrigerant supplying path 14-1. The discharge port 322-1*a* and the discharge port 322-1*b* are disposed below the refrigerant discharging path 15-1. Similarly, the supply port 321-2*a* and the supply port 321-2*b* are disposed below the refrigerant supplying path 14-2. Although description is omitted, the other supply ports and the other discharge ports are similarly disposed below the other refrigerant supplying path and the other refrigerant discharging path.

Figure 15:
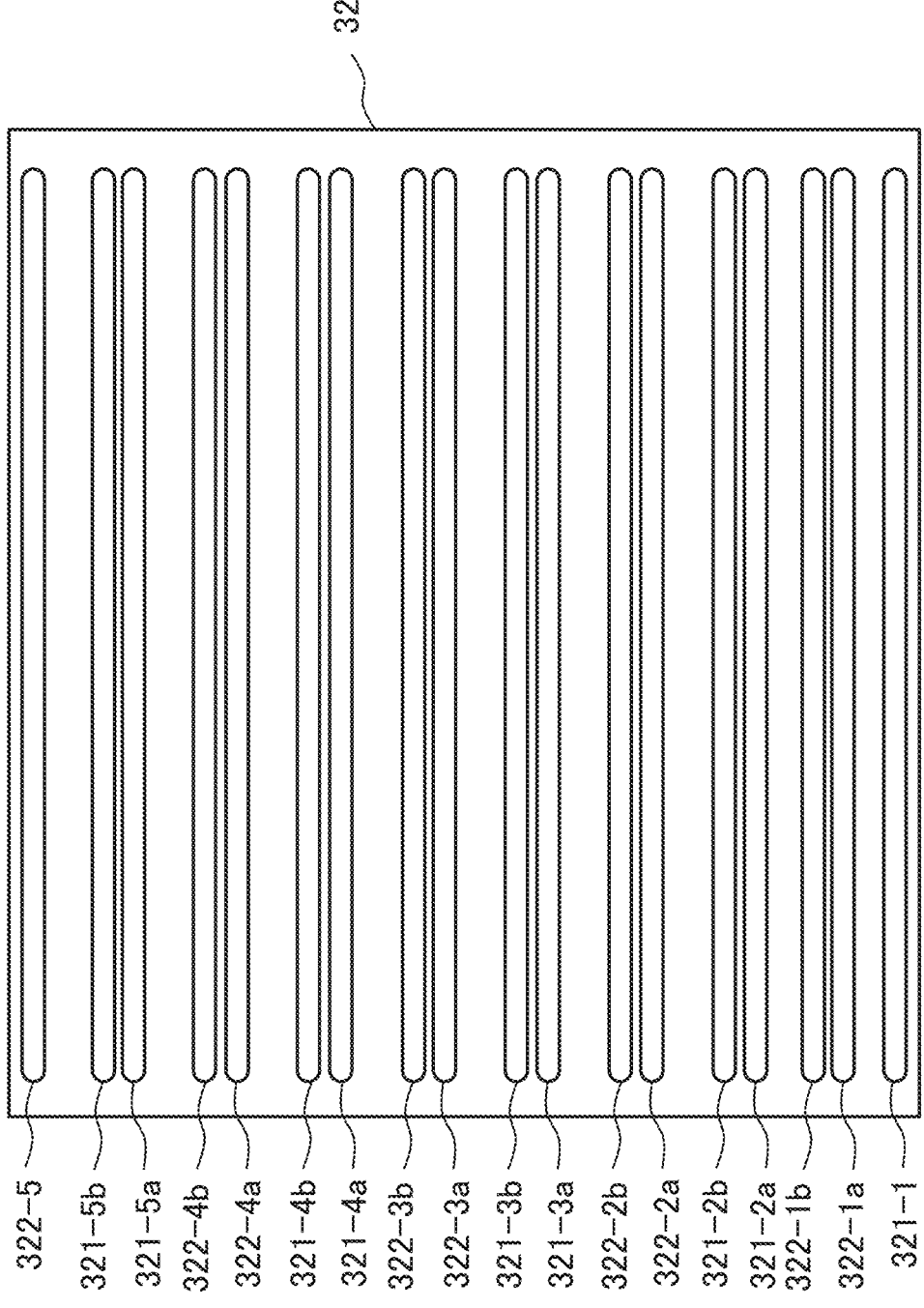
FIG. 15 is a plan view illustrating a configuration example of a refrigerant passing member of the cooling component according to the modification of the second example embodiment of the present invention.

As illustrated in FIGS. 14 and 15, each of the plurality of refrigerant supplying path 14-1 to 14-5 supplies the refrigerant to each of the plurality of heat dissipating plates 12-1 to 12-*n* from some through-holes (in the present modification, the supply ports 321-1 and 321-2*a* to 321-5*b*) among the plurality of through-holes (in the present modification, the supply ports 321-1 and 321-2*a* to 321-5*b* and the discharge ports 322-1*a* to 322-4*b* and 322-5).

As illustrated in FIGS. 14 and 15, each of the plurality of refrigerant discharging path 15-1 to 15-5 discharges the refrigerant that has passed through the remainder (in the present modification, the discharge ports 322-1*a* to 322-4*b* and 322-5) of the plurality of through-holes that is adjacent to the through-holes (in the present modification, the supply ports 321-1 and 321-2*a* to 321-5*b*) among the plurality of through-holes. The refrigerant is supplied from the plurality of heat dissipating plates 12-1 to 12-*n* to each of the plurality of refrigerant discharging path 15-1 to 15-5.

Each of convection chambers 16-1 to 16-*n* is provided with the discharge port 322-1*a* adjacent to the supply port 321-1. The discharge port 322-1*b* is provided adjacent to the discharge port 322-1*a* and the supply port 321-2*a*. In this manner, the supply ports 321-1 and 321-2*a* to 321-5*b* and the discharge ports 322-1*a* to 322-4*b* and 322-5 of the refrigerant passing member 32 are provided alternately every two above the convection chambers 16-1 to 16-*n*.

In the cooling component of the present modification, in the refrigerant passing member 32, the openings of the plurality of supply ports 321-1 and 321-2*a* to 321-5*b* and the plurality of discharge ports 322-1*a* to 322-4*b* and 322-5 are elliptical in shape and equal in size. In the cooling component of the present modification, the flow velocity of the refrigerant flowing into a predetermined convection chamber is increased by providing two supply ports at positions facing one predetermined refrigerant supplying path. This is because, as compared with a case where two supply ports are provided as one supply port (for example, the cooling component according to Modification 8 of the first example embodiment), the area of the opening of each supply port is narrowed, and thus the flow path is partially narrowed and the flow velocity is increased. As a result, in the cooling component of the present modification, the refrigerant is supplied to the heat dissipating plates 12-1 to 12-*n* and the heat receiving plate 11 without the amount of the refrigerant supplied per unit area and per unit time being concentrated, and at a higher flow speed than that in Modification 8 of the first example embodiment, and thus the cooling performance is improved.

Third Example Embodiment

A cooling component 4 according to the third example embodiment of the present invention will be described with reference to FIGS. 16 to 21.

Figure 16:
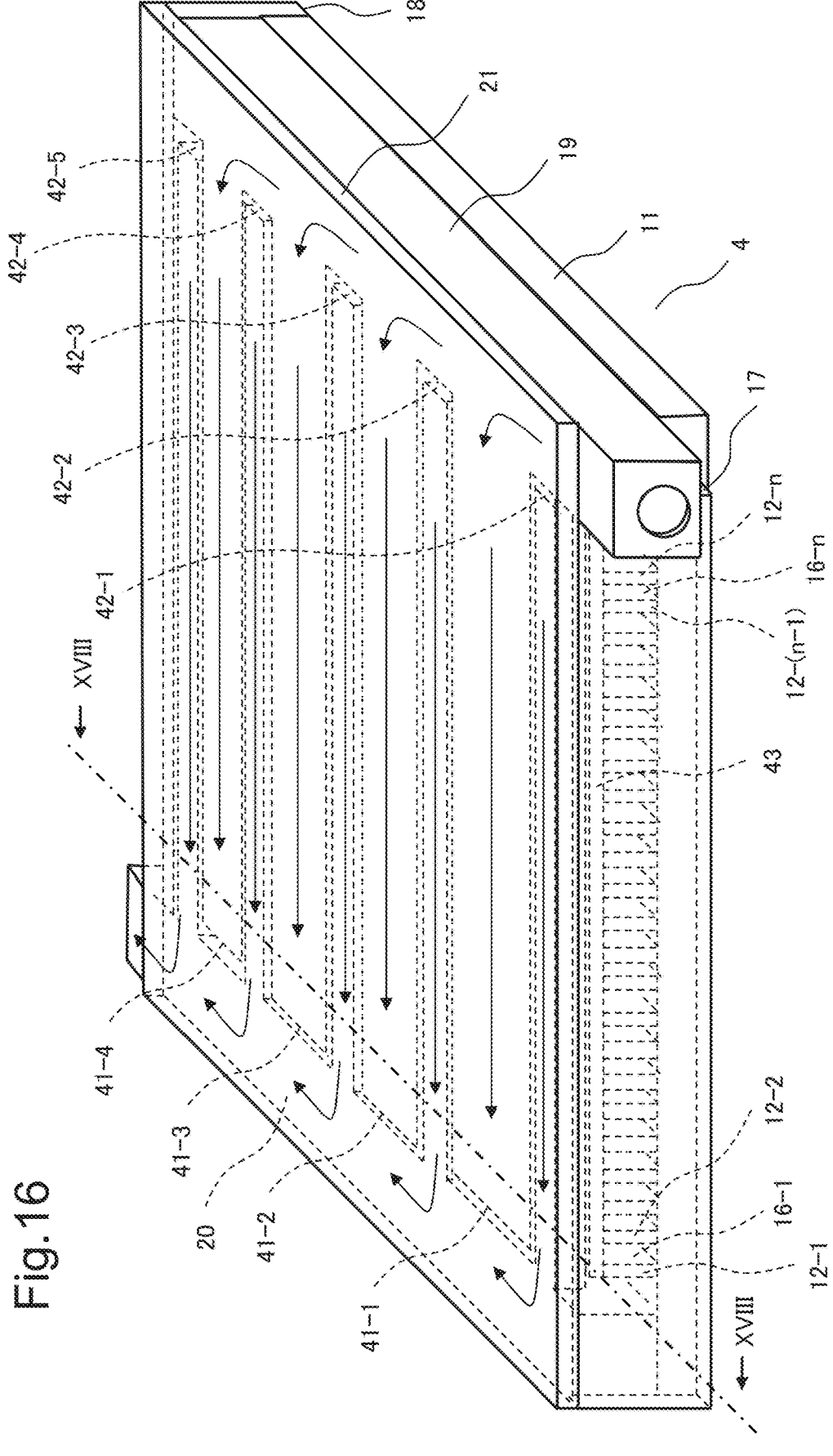
FIG. 16 is a transparent perspective view illustrating a configuration example of a cooling component according to a third example embodiment of the present invention.
Figure 17:
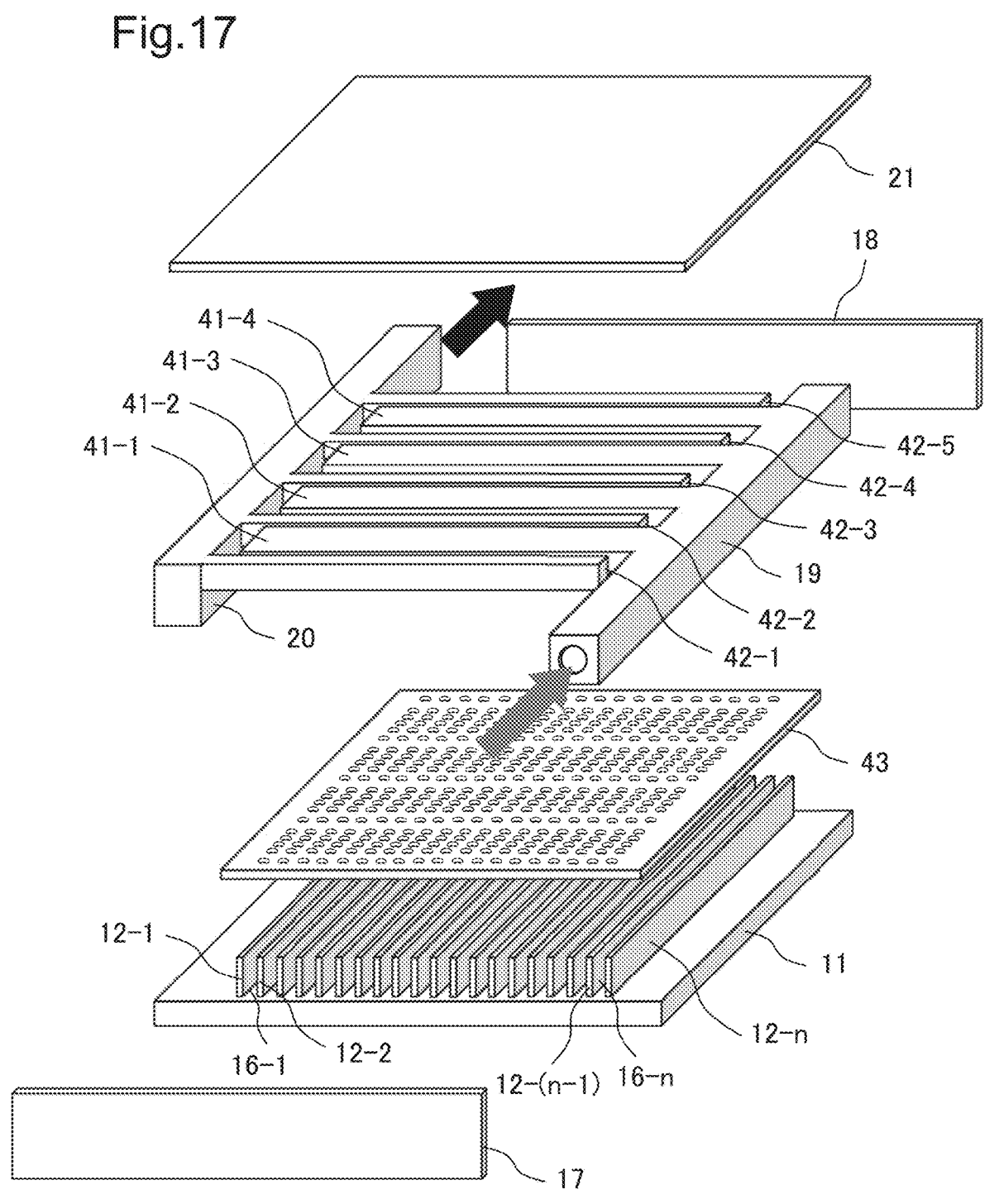
Figure 18:
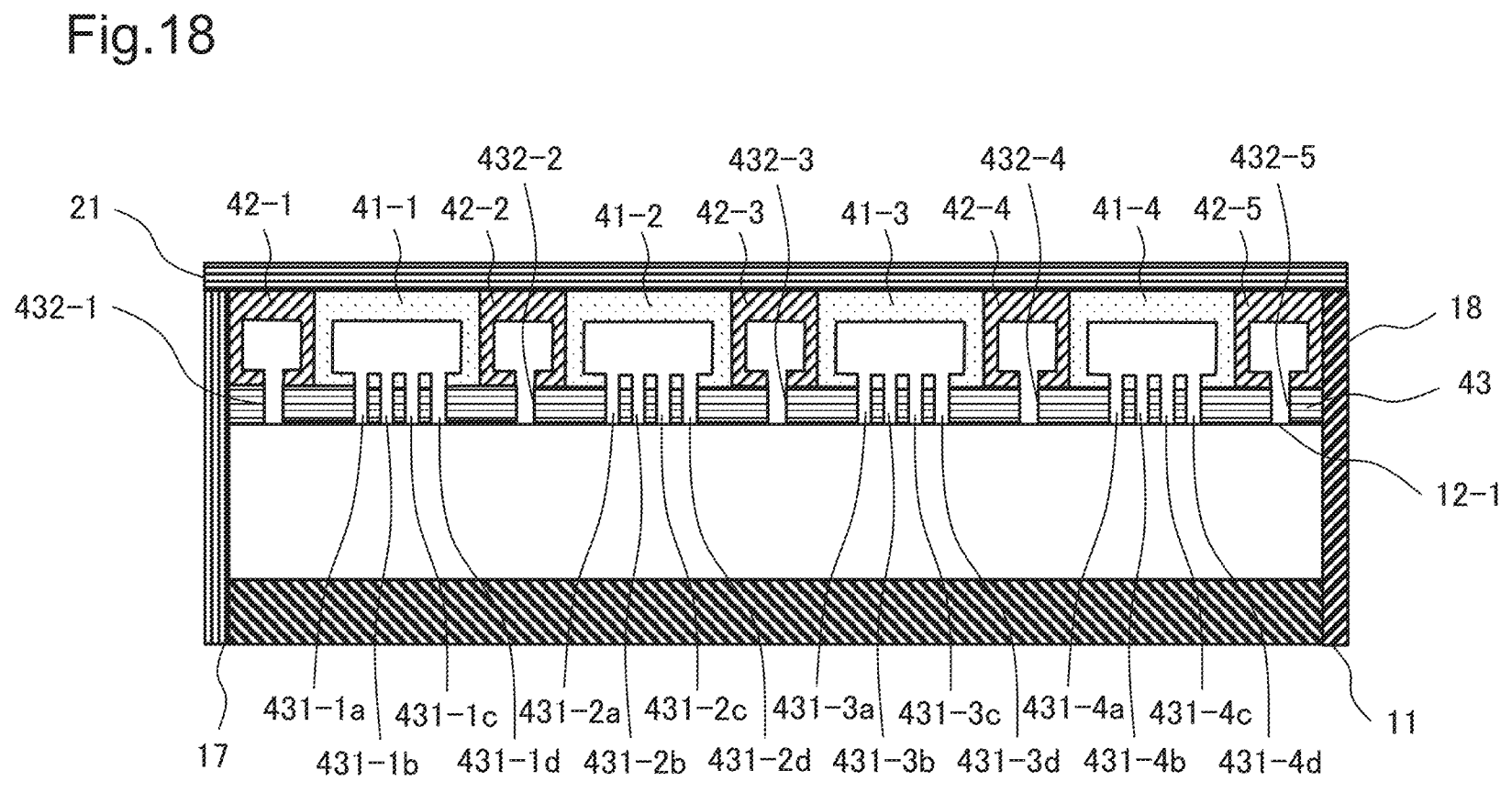
Figure 19:
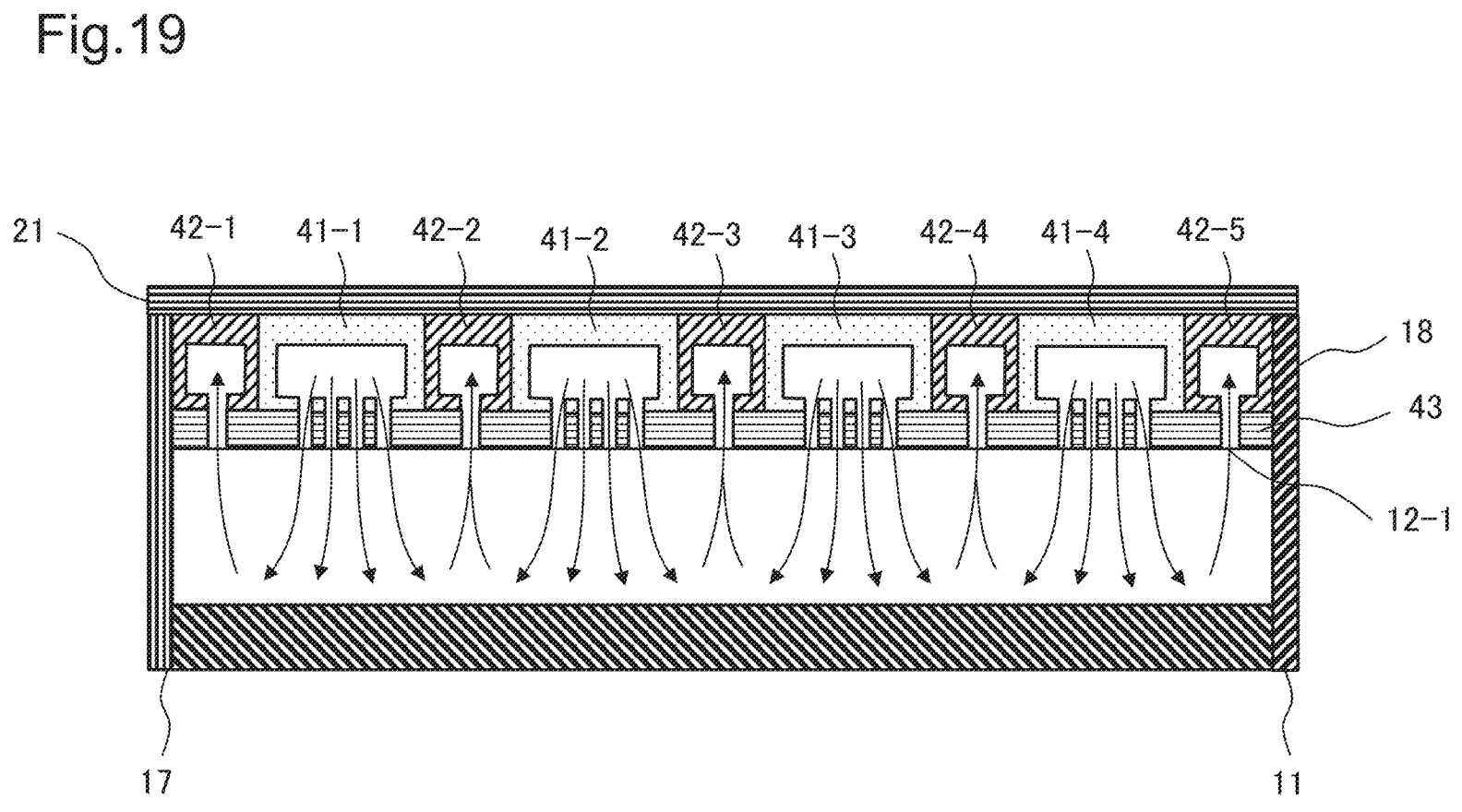

FIG. 16 is a transparent perspective view illustrating a configuration example of the cooling component 4 according to the present example embodiment. FIG. 17 is an exploded perspective view of the cooling component 4 illustrated in FIG. 16. FIG. 18 is a cross-sectional view of the cooling component 4 taken along line XVIII-XVIII in FIG. 16. FIG. 19 is a schematic view schematically illustrating a direction in which a refrigerant flows in the cross-sectional view (FIG. 18) of the cooling component 4 taken along line XVIII-XVIII in FIG. 16. Arrows in FIGS. 16 to 19 schematically indicate directions in which the refrigerant flows. In FIG. 16, line XVIII-XVIII is illustrated at a position between a heat dissipating plate 12-1 and a heat dissipating plate 12-2 to be described later and at a position where a convection chamber 16-1 is cut.

The cooling component 4 of the third example embodiment is different from the cooling component 1 of the first example embodiment illustrated in FIGS. 1 to 5 in the following features. The cooling component 4 is different from the cooling component 1 of the first example embodiment in that the number of supply ports provided for each of convection chambers 16-1 to 16-*n* formed in a refrigerant passing member 43 facing a predetermined refrigerant supplying path is larger than the number of discharge ports provided for each of the convection chambers 16-1 to 16-*n* formed in the refrigerant passing member 43 facing the predetermined refrigerant discharging path.

A heat receiving plate 11, heat dissipating plates 12-1 to 12-*n*, a partition plate 17, a partition plate 18, a supply pipe 19, a discharge pipe 20, and a top plate 21 of the cooling component 4 have the same configurations as those of the cooling component 1 in the first example embodiment. Therefore, the same reference signs as those in FIGS. 1 to 4 are given to the corresponding elements, and the common description will be omitted. The convection chambers 16-1 to 16-*n* of the cooling component 4 have the same configurations as the respective configurations of the cooling component 3 in the second example embodiment, and thus, the same reference signs as those in FIGS. 8 to 13 are given to the corresponding elements, and the common description will be omitted.

As illustrated in FIGS. 16 to 19, the cooling component 4 of the present example embodiment includes a plurality of refrigerant supplying path 41-1, 41-2, 41-3, and 41-4 disposed on the refrigerant passing member 43, and a plurality of refrigerant discharging path 42-1, 42-2, 42-3, 42-4, and 42-5 disposed on the refrigerant passing member 43. Since the configurations of the refrigerant supplying path 41-1 to 41-4 are similar to the configurations of the refrigerant supplying path 14-1 to 14-5 of the cooling component 1 illustrated in FIGS. 1 to 5, the common description will be omitted. Since the configurations of the refrigerant discharging path 42-1 to 42-5 are similar to the configurations of the refrigerant discharging path 15-1 to 15-5 of the cooling component 1 illustrated in FIGS. 1 to 5, the common description will be omitted.

The convection chambers 16-1 to 16-*n* are formed along the heat dissipating plates 12-1 to 12-*n*, respectively. The heat receiving plate 11 is disposed at bottoms of the convection chambers 16-1 to 16-n. The refrigerant passing member 43 is disposed above the convection chambers 16-1 to 16-n.

Figure 20:
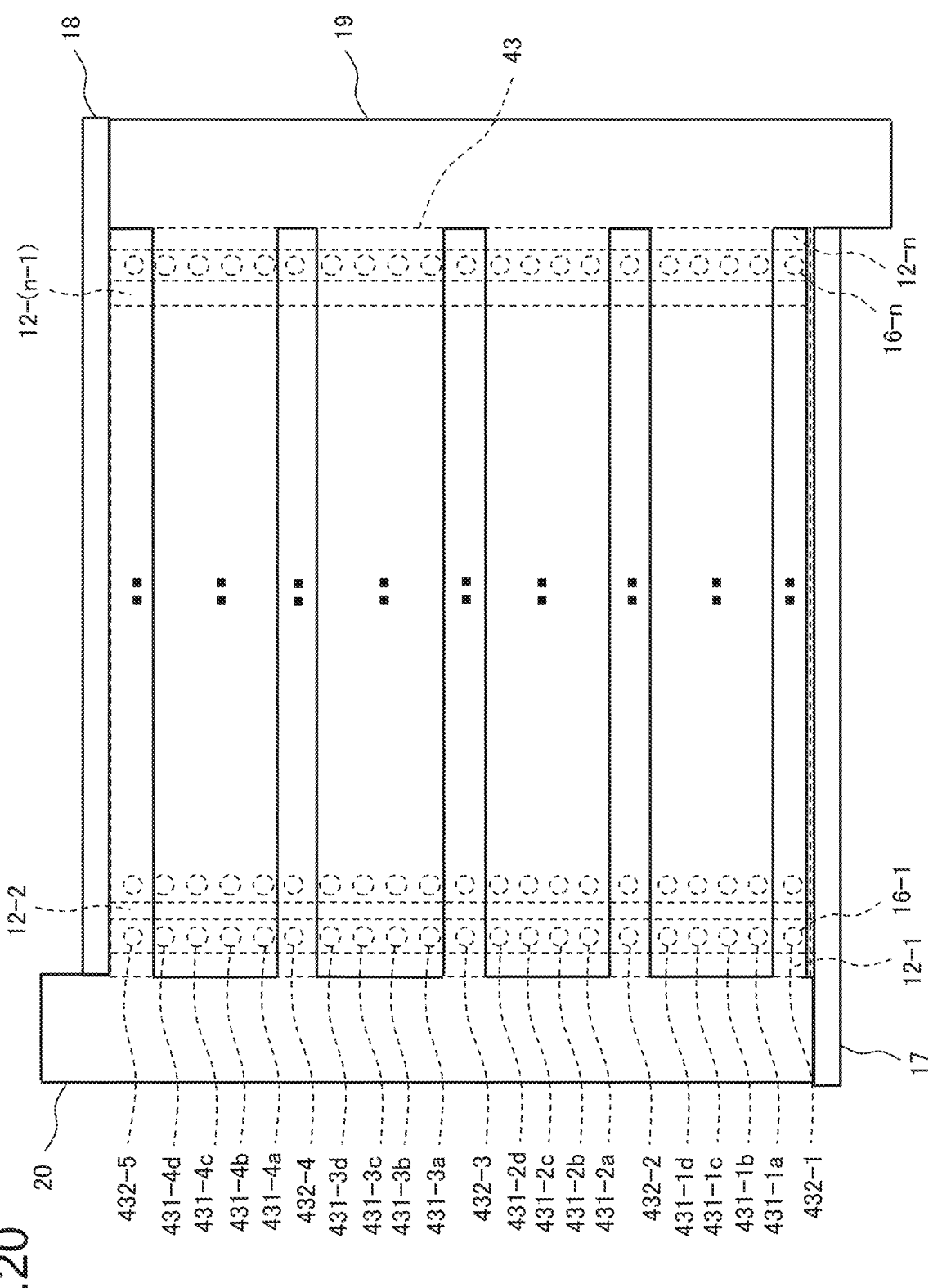
FIG. 20 is a top perspective view of the cooling component according to the third example embodiment of the present invention in a state where a top plate of the cooling component is removed.

FIG. 20 is a top perspective view of the cooling component 4 illustrated in FIG. 16 in a state where the top plate 21 of the cooling component 4 is removed. In FIG. 20, the refrigerant passing member 43 and the heat dissipating plates 12-1, 12-2, 12-(n−1), and 12-n are indicated by broken lines, and illustration of the other heat dissipating plates 12-3 to 12-(n−2) is omitted.

Figure 21:
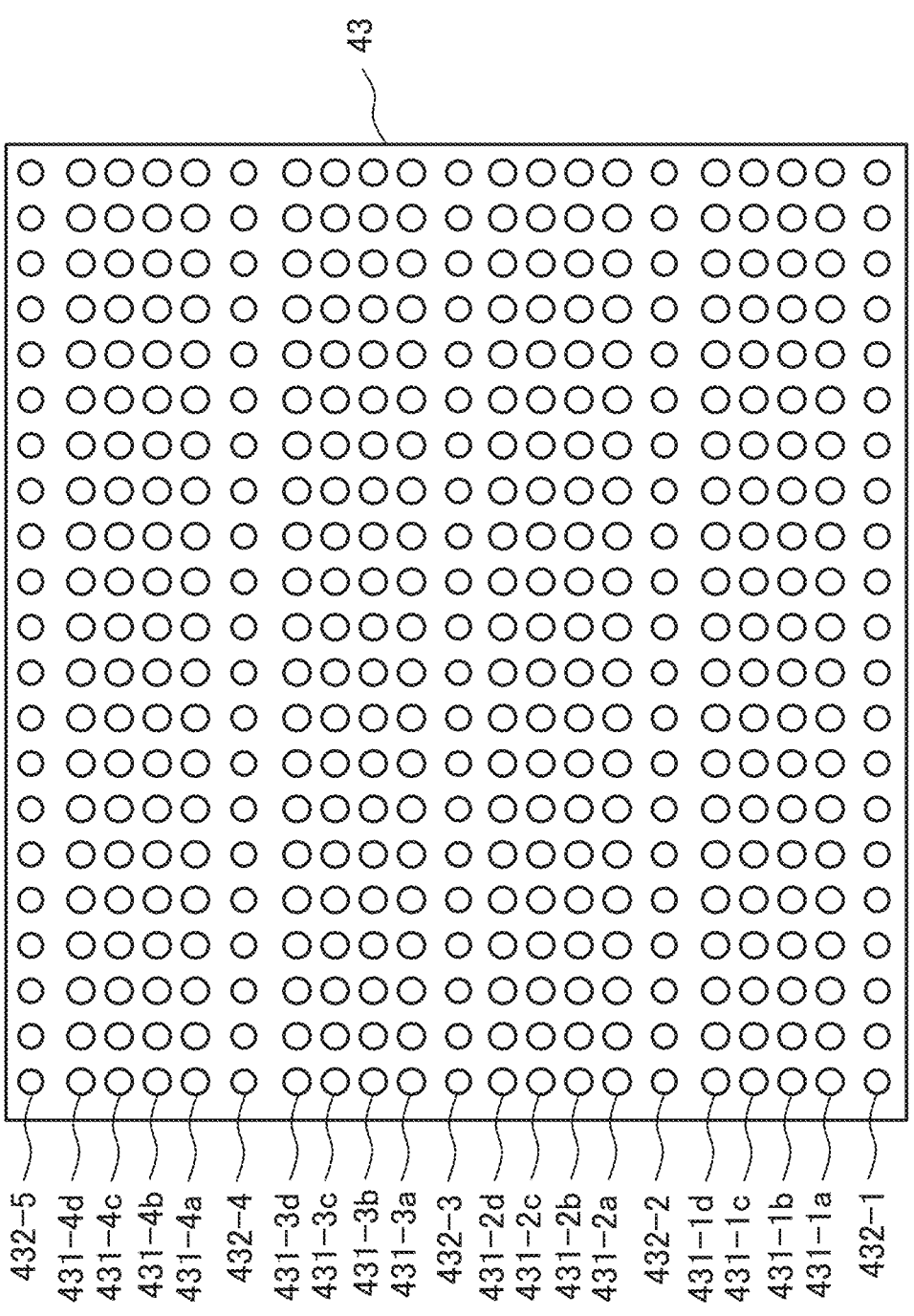
FIG. 21 is a plan view illustrating a configuration example of a refrigerant passing member of the cooling component according to the third example embodiment of the present invention.

FIG. 21 is a plan view illustrating a configuration example of the refrigerant passing member 43. The refrigerant passing member 43 has a plurality of through-holes (a plurality of supply ports 431-1a to 431-4d and a plurality of discharge ports 432-1 to 432-5 to be described later) through which the refrigerant passes. A flow path inside each of the refrigerant supplying path 41-1 to 41-4 is connected to each of some through-holes (in the present example embodiment, the supply ports 431-1a, 431-1b, 431-1c, 431-1d, . . . , 431-4a, 431-4b, 431-4c, and 431-4d) among the plurality of through-holes of the refrigerant passing member 43 illustrated in FIG. 21. Each of the refrigerant supplying path 41-1 to 41-4 supplies the refrigerant from the supply pipe 19 to each of the plurality of heat dissipating plates 12-1 to 12-n through each of the supply ports 431-1a to 431-4d. Meanwhile, a flow path inside each of the refrigerant discharging path 42-1 to 42-5 is connected to the remainder (in the present example embodiment, the discharge ports 432-1, 432-2, 432-3, 432-4, and 432-5) of the plurality of through-holes that is adjacent to the through-holes (in the present example embodiment, the supply ports 431-1a, 431-1d, 431-2a, 431-2d, 431-3a, 431-3d, 431-4a, and 431-4d) among the plurality of through-holes of the refrigerant passing member 43 illustrated in FIG. 21. Each of the refrigerant discharging path 42-1 to 42-5 discharges the refrigerant that has passed through each of the discharge ports 432-1 to 432-5. The refrigerant is supplied from the plurality of heat dissipating plates 12-1 to 12-n to each of the plurality of refrigerant discharging path 42-1 to 42-5.

Each of the convection chambers 16-1 to 16-n is provided with the plurality of supply ports 431-1a to 431-4d to which the refrigerant is supplied from any one of the refrigerant supplying path 41-1 to 41-4, and the plurality of discharge ports 432-1 to 432-5 from which the refrigerant is discharged to the refrigerant discharging path 42-1 to 42-5. As illustrated in FIG. 21, in the refrigerant passing member 43, the sizes and shapes of the openings of the plurality of supply ports 431-1a to 431-4d and the plurality of discharge ports 432-1 to 432-5 are the same. In the refrigerant passing member 43, the openings of the plurality of supply ports 431-1a to 431-4d and the plurality of discharge ports 432-1 to 432-5 have circular shapes.

The plurality of supply ports is, for example, a plurality of through-holes provided for each of the convection chambers 16-1 to 16-n and formed in the refrigerant passing member 43, in a direction orthogonal to the longitudinal direction of the heat dissipating plates 12-1 to 12-n, and at positions facing predetermined refrigerant supplying path. For example, the plurality of supply ports 431-1a are a plurality of through-holes provided in the refrigerant passing member 43 at positions facing the refrigerant supplying path 41-1 for each of the convection chambers 16-1 to 16-n. The plurality of supply ports 431-1b are a plurality of through-holes provided in the refrigerant passing member 43 at positions facing the refrigerant supplying path 41-1 for each of the convection chambers 16-1 to 16-n. Similarly, the plurality of supply ports 431-1c and the plurality of supply ports 431-1d are a plurality of through-holes provided in the refrigerant passing member 43 at positions facing the refrigerant supplying path 41-1 for the convection chambers 16-1 to 16-n. As described above, the refrigerant passing member 43 is provided with sets of four ports of the plurality of supply ports at positions facing each of the refrigerant supplying path 41-1 to 41-4, respectively.

Similarly to the plurality of supply ports, the plurality of discharge ports is, for example, a plurality of through-holes provided in the refrigerant passing member 43 at positions facing the predetermined refrigerant discharging path in the direction orthogonal to the longitudinal direction of the heat dissipating plates 12-1 to 12-n for each of the convection chambers 16-1 to 16-n. As described above, the refrigerant passing member 43 is provided with sets of one port of the plurality of discharge ports at positions facing each of the refrigerant discharging path 42-1 to 42-5.

Each of the refrigerant supplying path 41-1 to 41-4 facing the four sets of the plurality of supply ports has an upper surface having a larger width in the lateral direction of the upper surface than that of each of the refrigerant discharging path 42-1 to 42-5 facing one set of the plurality of discharge ports.

Above each convection chamber, the through-hole of the refrigerant passing member 43 is provided as follows. At least one or more discharge ports are provided for a first number of supply ports (for in the cooling component 4, the first number is 4) and at least one supply ports are provided for a second number of discharge ports (in the cooling component 4, the second number is 1). That is, each of the second number of discharge ports (in the cooling component 4, the second number is 1) are provided between adjacent two of the first number of supply ports (in the cooling component 4, the first number is 4) in the refrigerant passing member 43 above each convection chamber. Each of the first number and the second number is at least one. Above each convection chamber, the first number of through-holes formed in the refrigerant passing member 43 is larger than the second number of through-holes formed in the refrigerant passing member 43.

For example, one supply port 431-1a, . . . , one supply port 431-4d, one discharge port 432-1, . . . , and one discharge port 432-5 are arranged in parallel and in a line in the longitudinal direction of one heat dissipating plate. The plurality of discharge ports 432-1 are arranged below the refrigerant discharging path 42-1. Each of the plurality of supply ports 431-1a to 431-1d is arranged below the refrigerant supplying path 41-1. The plurality of discharge ports 432-2 are arranged below the refrigerant discharging path 42-2. Similarly, each of the plurality of supply ports 431-2a to 431-2d is arranged below the refrigerant supplying path 41-2. Although description is omitted, the other supply ports and the other discharge ports are similarly disposed below the other refrigerant supplying path and the other refrigerant discharging path.

The flow of the refrigerant and the heat reception will be described using the convection chamber 16-1 among the convection chambers 16-1 to 16-n as a representative. The following explanation applies to the other convection chambers as well.

The refrigerant is supplied to the supply pipe 19 from the outside of the cooling component 4. As illustrated in FIG. 16, the refrigerant passes through the supply pipe 19 in a direction from the partition plate 17 toward the partition plate 18. The refrigerant supplied to the supply pipe 19 is distributed to each of the refrigerant supplying path 41-1 to 41-4. The distributed refrigerant passes through the refrigerant supplying path 41-1 to 41-4 in the direction from the supply pipe 19 toward the discharge pipe 20.

The refrigerant is supplied to the convection chamber 16-1 from each of the supply ports 431-1a to 431-4d. As illustrated in FIGS. 18 and 19, the through-holes are formed in the bottom surface of each of the refrigerant supplying path 41-1 to 41-4 at predetermined intervals in the longitudinal direction of the refrigerant supplying path 41-1 to 41-4. The through-holes formed at the predetermined intervals in the longitudinal direction of the refrigerant supplying path 41-1 to 41-4 are connected to the plurality of supply ports 431-1a to 431-4d that are through-holes formed in the refrigerant passing member 43. For example, a part of the refrigerant passing through the refrigerant supplying path 41-1 passes through any one of one supply port 431-1a, one supply port 431-1b, one supply port 431-1c, and one supply port 431-1d that are through-holes of the refrigerant passing member 43, and is supplied to the convection chamber 16-1.

In the example of the convection chamber 16-1 of the cooling component 4 illustrated in FIGS. 16 to 21, heat generated from the cooling target object is transferred to the heat receiving plate 11, and is transferred from the heat receiving plate 11 to the heat dissipating plate 12-1, the heat dissipating plate 12-2, and the refrigerant. The heat transferred to the heat dissipating plate 12-1 and the heat dissipating plate 12-2 is also transferred to the refrigerant convectively flowing in the convection chamber 16-1. Then, the refrigerant is discharged to the outside of the convection chamber 16-1 from each of the discharge ports 432-1 to 432-5 adjacent to any one of the supply ports 431-1a to 431-4d among the plurality of through-holes. The refrigerant discharged to the outside of the convection chamber 16-1 is discharged to any one of the refrigerant discharging path 42-1 to 42-5.

As illustrated in FIGS. 18 and 19, the through-holes are formed in the bottom surface of each of the refrigerant discharging path 42-1 to 42-5 at predetermined intervals in the longitudinal direction of the refrigerant discharging path 42-1 to 42-5. The through-holes formed at the predetermined intervals in the longitudinal direction of the refrigerant discharging path 42-1 to 42-5 are connected to the plurality of discharge ports 432-1 to 432-5, respectively, which are through-holes formed in the refrigerant passing member 43. For example, a part of the refrigerant supplied to the convection chamber 16-1 passes through one discharge port 432-1 of the refrigerant passing member 43 and is discharged to the refrigerant discharging path 42-1.

The refrigerant discharged to any one of the refrigerant discharging path 42-1 to 42-5 passes through the discharge pipe 20 and is discharged to the outside of the cooling component 4.

As described above, in the third example embodiment of the present invention, the cooling component 4 includes the heat receiving plate 11 that receives heat from the cooling target object, and the plurality of heat dissipating plates 12-1 to 12-n disposed at predetermined intervals on the heat receiving plate 11. The cooling component 4 further includes the refrigerant supplying path 41-1 to 41-4 that supply the refrigerant to the plurality of heat dissipating plates 12-1 to 12-n, and the refrigerant discharging path 42-1 to 42-5 to which the refrigerant is supplied from the plurality of heat dissipating plates 12-1 to 12-n. The cooling component 4 includes the refrigerant passing member 43 having the plurality of through-holes through which the refrigerant passes. In the cooling component 4, the refrigerant supplied by the refrigerant supplying path 41-1 to 41-4 passes through some through-holes among the plurality of through-holes, and the refrigerant that has passed through the remainder of the plurality of through-holes is discharged by the refrigerant discharging path 42-1 to 42-5. In the cooling component 4, the through-holes among the plurality of through-holes and the remainder of the plurality of through-holes are adjacent to each other. As a result, the cooling component 4 can prevent the amount of the refrigerant supplied per unit time and per unit area of the heat dissipating plates 12-1 to 12-n and the heat receiving plate 11 that receive heat from the cooling target object from being concentrated. In this manner, since the refrigerant is supplied in such a way as not to be concentrated onto predetermined portions of the heat dissipating plates 12-1 to 12-n and the heat receiving plate 11, it is possible to cool the cooling target object substantially uniformly.

In the cooling component 4 of the present example embodiment, in the refrigerant passing member 43, the openings of the plurality of supply ports 431-1a to 431-4d and the plurality of discharge ports 432-1 to 432-5 are circular in shape and equal in size. Since four supply ports are provided at positions facing one predetermined refrigerant supplying path for one predetermined convection chamber, the area of the opening of each supply port is reduced. As a result, the flow path is partially thinned. Therefore, in the cooling component 4, for example, the flow velocity of the refrigerant flowing into the predetermined convection chamber becomes higher than that in a cooling component in which one supply port is formed by connecting four supply ports facing one predetermined refrigerant supplying path. The cooling component 4 supplies, to the heat dissipating plates 12-1 to 12-n and the heat receiving plate 11 that receive heat from the cooling target object, the refrigerant that flows at a flow speed higher than that in a cooling component in which one supply port is formed by connecting four supply ports facing one predetermined refrigerant supplying path, and thus cooling performance is improved.

In the cooling component 4 of the present example embodiment, each of the second number of discharge ports (in the cooling component 4, the second number is 1) is provided between adjacent two of the first number of supply ports (in the cooling component 4, the first number is 4) above each convection chamber. In the cooling component 4, the first number is larger than the second number. As a result, since the areas of the heat dissipating plates 12-1 to 12-n that contact the refrigerant supplied from the supply ports are larger than the areas of the heat dissipating plates 12-1 to 12-n that contact the refrigerant to be discharged, the cooling performance of the cooling component 4 is improved.

Modification 1 of Third Example Embodiment

A cooling component according to Modification 1 of the third example embodiment will be described with reference to FIGS. 22 and 23. In addition, since each configuration of the cooling component of the present modification is similar to each configuration of the cooling component 4 according to the third example embodiment except for a refrigerant passing member 44 to be described later, corresponding elements are denoted by the same reference signs as those in FIGS. 16 to 21, and description of the elements is omitted.

Figure 22:
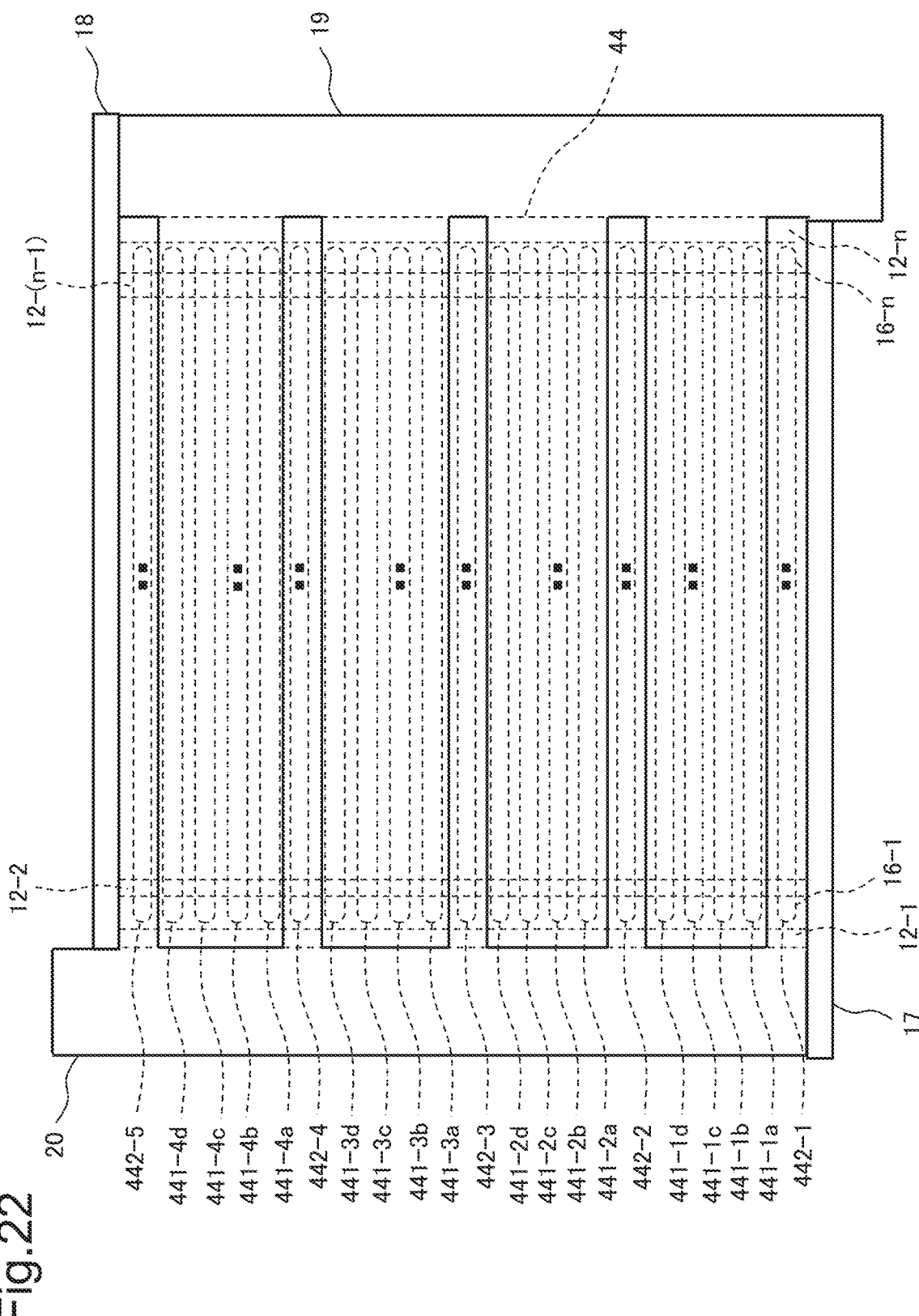
FIG. 22 is a top perspective view of a cooling component according to a modification of the third example embodiment of the present invention in a state where a top plate of the cooling component is removed.

FIG. 22 is a top perspective view of the cooling component according to the present modification in a state where a top plate 21 of the cooling component is removed. In FIG. 22, heat dissipating plates 12-1, 12-2, 12-(n−1), and 12-n are indicated by broken lines, and illustration of other heat dissipating plates 12-3 to 12-(*n*−2) is omitted. FIG. 23 is a plan view illustrating a configuration example of the refrigerant passing member 44.

In the cooling component according to Modification 1 of the third example embodiment, supply ports 441-1*a*, 441-1*b*, 441-1*c*, 441-1*d*, . . . , 441-4*a*, 441-4*b*, 441-4*c*, and 441-4*d* that are through-holes are formed in the refrigerant passing member 44. Each of the supply ports 441-1*a* to 441-4*d* is one through-hole provided for each of the convection chambers 16-1 to 16-*n*, formed in the refrigerant passing member 44 at a position facing a predetermined refrigerant supplying path, and having an elliptical opening. The longitudinal direction of the opening of each of the supply ports 441-1*a* to 441-4*d* is the same as the longitudinal direction of an upper surface of each of refrigerant supplying path 41-1 to 41-4.

Each of the supply ports 441-1*a* to 441-1*d* is a through-hole provided in the refrigerant passing member 44 at a position facing the refrigerant supplying path 41-1 for each of the convection chambers 16-1 to 16-*n*. Each of the supply ports 441-2*a* to 441-2*d* is a through-hole provided in the refrigerant passing member 44 at a position facing the refrigerant supplying path 41-2 for each of the convection chambers 16-1 to 16-*n*. As described above, the refrigerant passing member 44 is provided with four supply ports at positions facing the respective refrigerant supplying path 41-1 to 41-4. In the examples illustrated in FIGS. 22 and 23, the lengths of the openings of the supply ports 441-1*a* to 441-4*d* in the lateral direction of the openings are equal. In the examples illustrated in FIGS. 22 and 23, the lengths of the openings of the supply ports 441-1*a* to 441-4*d* in the longitudinal direction of the openings are equal.

In the cooling component according to the present modification, discharge ports 442-1, 442-2, 442-3, 442-4, and 442-5 that are through-holes are formed in the refrigerant passing member 44. Each of the discharge ports 442-1 to 442-5 is one through-hole provided for each of the convection chambers 16-1 to 16-*n*, formed in the refrigerant passing member 44 at a position facing a predetermined refrigerant discharging path, and having an elliptical opening. The longitudinal direction of the opening of each of the discharge ports 442-1 to 442-5 is the same as the longitudinal direction of the upper surface of each of the refrigerant discharging path 42-1 to 42-5.

The discharge port 442-1 is a through-hole provided in the refrigerant passing member 44 at a position facing the refrigerant discharging path 42-1 for each of the convection chambers 16-1 to 16-*n*. The discharge port 442-2 is a through-hole provided in the refrigerant passing member 44 at a position facing the refrigerant discharging path 42-2 for each of the convection chambers 16-1 to 16-*n*. As described above, the refrigerant passing member 44 is provided with one discharge port at a position facing one predetermined refrigerant discharging path. As illustrated in FIGS. 22 and 23, the openings of the discharge ports 442-1 to 442-5 in the lateral direction of the openings are equal. As illustrated in FIGS. 22 and 23, the openings of the discharge ports 442-1 to 442-5 in the longitudinal direction of the openings are equal.

Each of the supply ports 441-1*a* to 441-1*d* is disposed below the refrigerant supplying path 41-1. The discharge port 442-1 is disposed below the refrigerant discharging path 42-1. Similarly, each of the supply ports 441-2*a* to 441-2*d* is disposed below the refrigerant supplying path 41-2. Although description is omitted, the other supply ports and the other discharge ports are similarly disposed below the other refrigerant supplying path and the other refrigerant discharging path.

Figure 23:
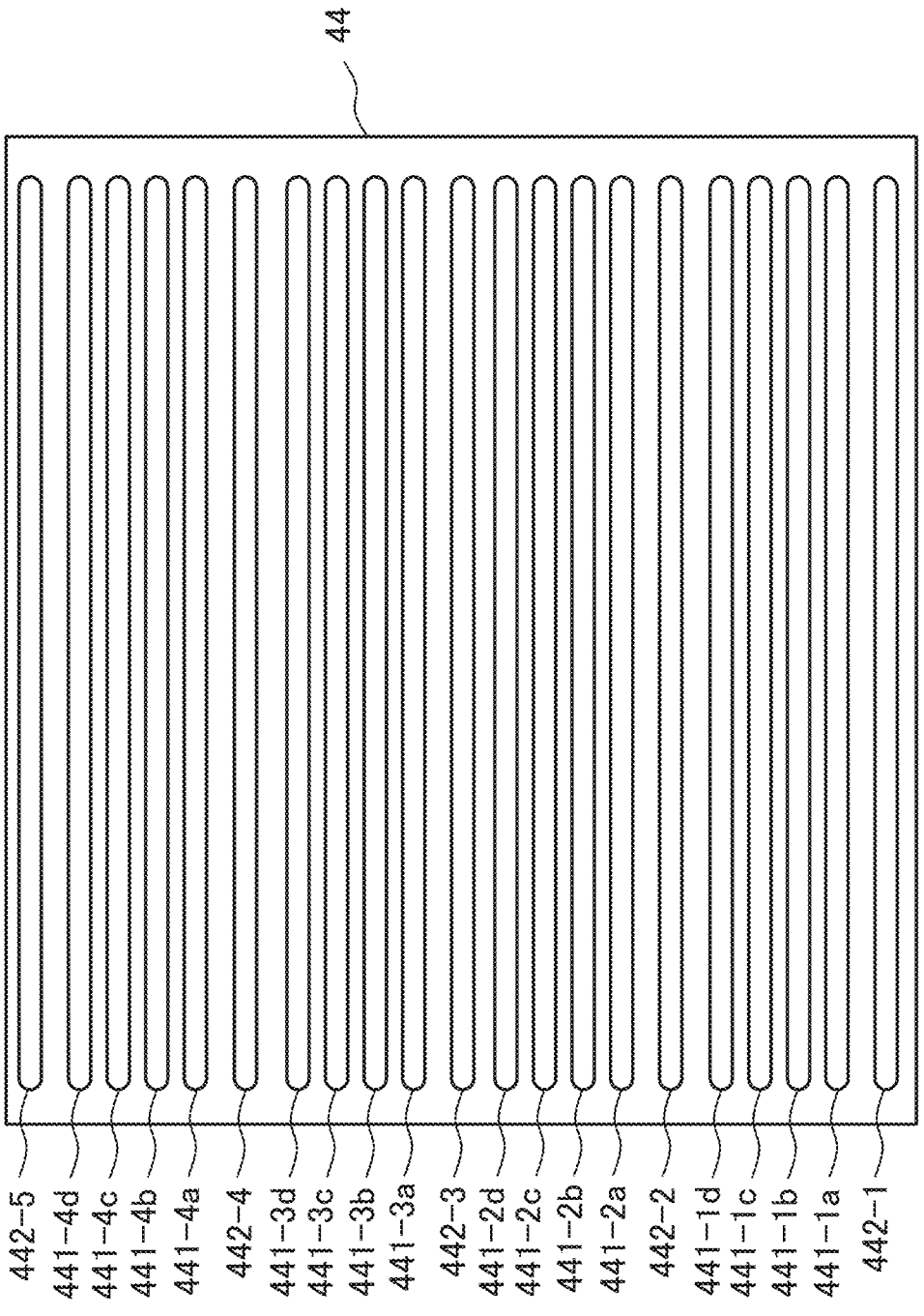
FIG. 23 is a plan view illustrating a configuration example of a refrigerant passing member of the cooling component according to the modification of the third example embodiment of the present invention.

As illustrated in FIGS. 22 and 23, each of the plurality of refrigerant supplying path 41-1 to 41-4 supplies the refrigerant to each of the plurality of heat dissipating plates 12-1 to 12-*n* from some through-holes (in the present modification, the supply ports 441-1*a* to 441-4*d*) among the plurality of through-holes (in the present modification, the supply ports 441-1*a* to 441-4*d* and the discharge ports 442-1 to 442-5).

As illustrated in FIGS. 22 and 23, each of the plurality of refrigerant discharging path 42-1 to 42-5 discharges the refrigerant that has passed through the remainder (in the present modification, the discharge ports 442-1 to 442-5) of the plurality of through-holes that is adjacent to the through-holes (in the present modification, the supply ports 441-1*a*, 441-1*d*, 441-2*a*, 441-2*d*, 441-3*a*, 441-3*d*, 441-4*a*, and 441-4*d*) among the plurality of through-holes. The refrigerant is supplied from the plurality of heat dissipating plates 12-1 to 12-*n* to each of the plurality of refrigerant discharging path 42-1 to 42-5.

Each of the convection chambers 16-1 to 16-*n* is provided with the discharge port 442-1 adjacent to the supply port 441-1*a*. The discharge port 442-2 is provided adjacent to the supply port 441-1*d* and the supply port 441-2*a*. In this manner, each of the discharge ports 442-1 to 442-5 of the refrigerant passing member 44 is provided for every four supply ports above each of the convection chambers 16-1 to 16-*n*.

In the cooling component of the present modification, in the refrigerant passing member 44, the openings of the plurality of supply ports 441-1*a* to 441-4*d* and the plurality of discharge ports 442-1 to 442-5 are elliptical in shape and equal in size.

Each of the above-described embodiments is a preferred embodiment of the present invention, and various modifications can be made without departing from the gist of the present invention.

Although the present invention has been described above with reference to the example embodiments, the present invention is not limited to the above example embodiments. Various modifications that can be understood by those skilled in the art can be made to the configurations and details of the present invention within the scope of the present invention.

This application claims priority based on Japanese Patent Application No. 2021-097539 filed on Jun. 10, 2021, the entire disclosure of which is incorporated herein.

REFERENCE SIGNS LIST

1, 3, 4 cooling component
11 heat receiving plate
12-1 to 12-*n* heat dissipating plate
13, 22, 31, 32, 43, 44 refrigerant passing member
131-1 to 131-5, 221-1 to 221-5, 311-1, 311-2*a* to 311-5*b*, 321-1, 321-2*a* to 321-5*b*, 431-1*a* to 431-4*d*, 441-1*a* to 441-4*d* supply port
132-1 to 132-5, 222-1 to 222-5, 312-1*a* to 312-4*b*, 312-5, 322-1*a* to 322-4*b*, 322-5, 432-1 to 432-5, 442-1 to 442-5 discharge port
14-1 to 14-5, 41-1 to 41-4 refrigerant supplying path
15-1 to 15-5, 42-1 to 42-5 refrigerant discharging path
16-1 to 16-*n* convection chamber
17 partition plate
18 partition plate 19 supply pipe
20 discharge pipe
21 top plate
What is claimed is:

1. A cooling component comprising:

a heat receiving plate configured to receive heat from a cooling target object;

a plurality of heat dissipating plates disposed at predetermined intervals on the heat receiving plate;

a refrigerant supplying path configured to supply a refrigerant to the plurality of heat dissipating plates;

a refrigerant discharging path configured to be supplied with the refrigerant from the plurality of heat dissipating plates;

a refrigerant passing member in which a plurality of through-holes through which the refrigerant passes are formed; and a plurality of convection chambers surrounded by the heat receiving plate, each of the plurality of heat dissipating plates, and the refrigerant passing member, are provided, wherein the refrigerant supplying path is configured to supply the refrigerant to each of the plurality of convection chambers from a plurality of supply ports that are some through-holes among the plurality of through-holes, wherein the refrigerant supplied to the plurality of convection chambers is discharged to the refrigerant discharging path from a plurality of discharge ports that are the remainder of the plurality of through-holes, wherein each of a second number of the discharge ports is provided between adjacent two of a first number of the supply ports, above a predetermined convection chamber among the plurality of convection chambers, each of the first number and the second number is at least one, wherein the first number is equal to the second number, and wherein the some through-holes among the plurality of through-holes and the remainder of the plurality of through-holes are adjacent to each other.

2. The cooling component according to claim 1, wherein the refrigerant supplying path and the refrigerant discharging path are formed in the refrigerant passing member.

3. The cooling component according to claim 1, wherein one of a plurality of the refrigerant discharging path is disposed between adjacent two of a plurality of the refrigerant supplying path.

* * * * *